United States Patent
Fathoni et al.

(10) Patent No.: US 11,521,645 B2
(45) Date of Patent: Dec. 6, 2022

(54) MAGNETORESISTIVE ELEMENT, MAGNETIC SENSOR, REPRODUCING HEAD, AND MAGNETIC RECORDING AND REPRODUCING DEVICE

(71) Applicant: National Institute for Materials Science, Tsukuba (JP)

(72) Inventors: Kresna Bondan Fathoni, Tsukuba (JP); Yuya Sakuraba, Tsukuba (JP); Taisuke Sasaki, Tsukuba (JP); Tomoya Nakatani, Tsukuba (JP); Yoshio Miura, Tsukuba (JP); Kazuhiro Hono, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 17/295,124

(22) PCT Filed: Jun. 27, 2019

(86) PCT No.: PCT/JP2019/025635
§ 371 (c)(1),
(2) Date: May 19, 2021

(87) PCT Pub. No.: WO2020/110360
PCT Pub. Date: Jun. 4, 2020

(65) Prior Publication Data
US 2022/0005499 A1    Jan. 6, 2022

(30) Foreign Application Priority Data
Nov. 29, 2018   (JP) .............................. JP2018-223592

(51) Int. Cl.
*G11B 5/39*    (2006.01)
*H01L 43/02*   (2006.01)
(Continued)

(52) U.S. Cl.
CPC .......... *G11B 5/3906* (2013.01); *G01R 33/093* (2013.01); *G11B 5/39* (2013.01);
(Continued)

(58) Field of Classification Search
None
See application file for complete search history.

(56) References Cited

U.S. PATENT DOCUMENTS 5,549,978 A    8/1996   Iwasaki et al.
6,111,784 A *  8/2000   Nishimura .......... G11C 11/1675
                                                  365/158
(Continued)

FOREIGN PATENT DOCUMENTS

JP    H06-325934 A      11/1994
JP    2015-049927 A      3/2015
JP    2017027647 A *     2/2017

OTHER PUBLICATIONS

Seigler et al., "Current-in-Plane Giant Magnetoresistance Sensor Using a Thin Cu Spacer and Dual Nano-Oxide Layers With a DR Greater Than 20 Ohms/sq," IEEE Transaction on Magnetics, 43 (2): 651-656 (2007).
(Continued)

*Primary Examiner* — Jefferson A Evans
(74) *Attorney, Agent, or Firm* — Morgan, Lewis & Bockius LLP

(57) ABSTRACT

The present disclosure provides: a magnetoresistive element having a large magnetoresistance change ratio (MR ratio); and a magnetic sensor, a reproducing head and a magnetic recording and reproducing device. The magnetoresistive element comprises a magnetoresistive film including a pair of body centered cubic (bcc) crystal structure CoFe ferro-
(Continued)

magnetic layers with a (001) crystal orientation, the pair of layers separated by a non-magnetic layer of Cu with bcc crystal structure.

20 Claims, 18 Drawing Sheets

(51) Int. Cl.
  *G01R 33/09* (2006.01)
  *H01L 43/08* (2006.01)
  *H01L 43/10* (2006.01)

(52) U.S. Cl.
  CPC ............ *G11B 5/3932* (2013.01); *H01L 43/02* (2013.01); *H01L 43/08* (2013.01); *H01L 43/10* (2013.01); *G11B 2005/3996* (2013.01)

(56) References Cited

U.S. PATENT DOCUMENTS

| | | | | |
|---|---|---|---|---|
| 2005/0266274 | A1* | 12/2005 | Hasegawa | G11B 5/372 428/828 |
| 2007/0081276 | A1* | 4/2007 | Fukuzawa | G11B 5/398 360/313 |
| 2008/0008909 | A1* | 1/2008 | Fuji | H01F 10/3254 428/811.3 |
| 2008/0239591 | A1* | 10/2008 | Fuji | G11B 5/39 360/324.12 |
| 2009/0168263 | A1* | 7/2009 | Hong | B82Y 25/00 360/324 |
| 2011/0007420 | A1* | 1/2011 | Tsuchiya | G11B 5/3929 360/234.3 |
| 2012/0192998 | A1* | 8/2012 | Fukuzawa | B25G 1/102 148/222 |
| 2014/0103472 | A1* | 4/2014 | Kent | H01F 10/3286 257/421 |
| 2014/0362477 | A1* | 12/2014 | Fuji | H01L 43/10 360/324 |
| 2015/0062735 | A1 | 3/2015 | Sapozhnikov et al. | |
| 2017/0177514 | A1* | 6/2017 | Lee | G06F 3/0647 |
| 2018/0123925 | A1* | 5/2018 | Sinha | H04L 43/06 |

OTHER PUBLICATIONS

"Magnetoelectronics" 1st Edition, Chapter 2, 2. 3. 3 CIP transport properties, edited by M. Johnson, Dec. 2, 2004.

Yuasa et al., "Giant tunneling magnetoresistance up to 410% at room temperature in fully epitaxial Co/MgO/Co magnetic tunnel junctions with bcc Co(001) electrodes," Applied Physics Letters 89, 04505 (2006).

Heinrich et al., "Ferromagnetic and Antiferromagnetic Exchange Coupling in bcc Epitaxial Ultrathin Fe(001)/Cu(001)/Fe(001) Trilayers," Physical Review Letters, 64 (6): 673-677, 1990.

Fathoni et al., "Band match enhanced current-in-plane giant magnetoresistance in epitaxial Co50Fe50/Cu multilayers with metastable bcc-Cu spacer" APL Materials, 7, 111106-7 (2019).

Fathoni et al., "Large MR ratio in epitaxial Co50Fe50/Cu/Co50Fe50 current-in-plane giant magnetoresistive devices," Abstracts of the 42nd Annual Conference on Magnetics in Japan, 2018, 13aB-4, p. 145.

Fathoni et al., "Large MR Ratio by Using Metastable bcc-Cu Spacer Layer in Epitaxial Current In-Plane Giant Magnetoresistance Devices," Abstracts of the 2019 Joint MMM-Intermag Conference, Jan. 14-18, 2019 Washington, DC, Presentation No. AG-11.

International Search Report issued in corresponding International Patent Application No. PCT/JP2019/025635 dated Sep. 17, 2019.

International Preliminary Report on Patentability and Written Opinion issued in corresponding International Patent Application No. PCT/JP2019/025635 dated Jun. 10, 2021.

* cited by examiner

MAGNETORESISTIVE ELEMENT, MAGNETIC SENSOR, REPRODUCING HEAD, AND MAGNETIC RECORDING AND REPRODUCING DEVICE

TECHNICAL FIELD

The present invention relates to a magnetoresistive device, a magnetic sensor, a reproducing head, and a magnetic recording and reproducing device.

BACKGROUND ART

A magnetoresistive device, having a multilayer film of a pair of ferromagnetic layers and a non-magnetic layer sandwiched between them, is known. Such a magnetoresistive device is used as a CIP (i.e., current in plane) type in which a current flows in the in-plane direction of the multilayer film or as a CPP (i.e., current perpendicular to plane) type in which a current flows in the lamination direction of the multilayer film.

The CIP type magnetoresistive device has the advantage of less noise than a tunnel magnetoresistive device, but the magnetoresistance change ratio (MR ratio) is small, and it is required to increase the MR ratio for high sensitivity as a magnetic sensor.

As for such a CIP type magnetoresistive device, a magnetoresistive device using $Co_{90}Fe_{10}$ as the ferromagnetic layer and Cu as the non-magnetic layer is known (see, for example, Patent Literature 1). According to Example 1 of Patent Literature 1, it is described that in a magnetoresistive device having a spin valve structure of $Co_{90}Fe_{10}$/Cu/$Co_{90}Fe_{10}$/FeMn/Ti in which a $Co_{90}Fe_{10}$ film, a Cu film, a $Co_{90}Fe_{10}$ film, an FeMn film, and a Ti film were sequentially formed on the C-plane sapphire substrate, the $Co_{90}Fe_{10}$ layer had a (111) orientated fcc phase, and further that the magnetoresistive device exhibited a magnetoresistance change ratio (MR ratio) of 10%. However, in order to improve the sensitivity as a magnetic sensor, the MR ratio is required to be further improved.

In recent years, a CIP type magnetoresistive device having an MR ratio of 25% has been developed (see, for example, Non-Patent Literature 1). According to Non-Patent Literature 1, the CIP type magnetoresistive device having the structure of $SiO_x$/NiFeCr/$CoFeO_x$/$Co_{90}Fe_{10}$/Cu/$Co_{90}Fe_{10}$/AlO, using a silicon thermal oxide film as a substrate exhibits an MR ratio of more than 25%. However, since providing layers such as NiFeCr and $CoFeO_x$ in addition to the ferromagnetic layer is required, its process comes to be complicated. Additionally, since the MR ratio is improved by utilizing specular reflection in the $CoFeO_x$ layer, there is a problem that an improvement in MR ratio due to multilayering cannot be obtained.

Also, in such a magnetoresistive device, it has been reported that the transmittance of spin electrons at the interface between layers affects the MR ratio (see, for example, Non-Patent Literature 2). "Chapter 2, 2. 3. 3 CIP transport properties" of Non-Patent Literature 2 reports that because of good matching between the band structure of electrons with majority spin in the ferromagnetic layer and the band structure of electrons in the non-magnetic layer, the transmittance of the majority-spin electrons increases and the MR ratio improves. However, neither Patent Literature 1 above nor Non-Patent Literature 1 above report any matching of the band structures of electrons between the ferromagnetic layer of the binary alloy composed of Co and Fe and the non-magnetic layer composed of Cu.

In view of such circumstances, the development of a magnetoresistive device has been desired, in which a large MR ratio can be obtained, especially when a current flows in the plane direction, by using a ferromagnetic layer of a binary alloy composed of Co and Fe and a non-magnetic layer composed of Cu.

CITATION LIST

Patent Literature

PATENT LITERATURE 1: JP 06-325934 A

Non-Patent Literature

NON-PATENT LITERATURE 1: M. Seigler, IEEE Transaction on Magnetics, Vol. 43, No. 2, 651-656, 2007

NON-PATENT LITERATURE 2: "Magnetoelectronics" 1st Edition, Chapter 2, 2. 3. 3 CIP transport properties, edited by M. Johnson, Dec. 2, 2004

SUMMARY OF INVENTION

Technical Problem

From the above, the problems of the present invention are to provide: a magnetoresistive device having a large magnetoresistance change ratio (i.e., MR ratio); and a magnetic sensor, a reproducing head, and a magnetic recording and reproducing device, each of which has high sensitivity to a magnetic field due to the large MR ratio.

Solution to Problem

In a magnetoresistive device provided with a magnetoresistive film according to the present invention, the magnetoresistive film is provided with at least a pair of ferromagnetic layers and a non-magnetic layer positioned between the pair of ferromagnetic layers, in which each of the pair of ferromagnetic layers is a layer having a body-centered cubic (bcc) crystal structure and being represented by the general formula: $Co_{100-p}Fe_p$ (wherein the parameter p satisfies a value in a range of $0 \leq p \leq 75$, and the ferromagnetic layers constituting the pair have a same value for the parameter p each other or a different value for the parameter p each other), the non-magnetic layer is a layer having a body-centered cubic (bcc) crystal structure and being composed of Cu, and each of the pair of ferromagnetic layers and the non-magnetic layer is a single crystal (001)-oriented layer or is preferentially oriented on a (001) crystal plane, and thereby solving the above problems.

The parameter p may satisfy a value in a range of $0 \leq p \leq 70$.

The parameter p may satisfy a value in a range of $p=0$ or $20 \leq p \leq 75$.

The parameter p may satisfy a value in a range of $p=0$ or $22 \leq p \leq 70$.

The parameter p may satisfy a value in a range of $0 \leq p \leq 65$.

The parameter p may satisfy a value in a range of $p=0$ or $25 \leq p \leq 65$.

The non-magnetic layer may have a thickness in the range of 1.5 nm or more and 5 nm or less.

Each of the ferromagnetic layers constituting the above pair may have a thickness in the range of 1.5 nm or more and 15 nm or less.

The magnetoresistive film may further be provided with an antiferromagnetic layer that is magnetically coupled to one of the ferromagnetic layers constituting the above pair.

The antiferromagnetic layer may be selected from the group consisting of an IrMn layer, an FeMn layer, a PtMn layer, and a CoO layer.

The magnetoresistive film may have two or more multilayer structures, each of which is composed of the pair of ferromagnetic layers and the non-magnetic layer positioned between the pair of ferromagnetic layers, and each of the two or more multilayer structures may be separated by an insulating layer.

The magnetoresistive film may have an artificial lattice structure in which the ferromagnetic layer and the non-magnetic layer are repeatedly laminated.

Each of the ferromagnetic layers may have a different coercive force.

The magnetoresistive film is positioned on a substrate, and the substrate may be selected from the group consisting of a glass substrate, an alumina substrate, Si single crystal with/without a thermal oxide film, MgO single crystal, sapphire single crystal, $SrTO_3$ single crystal, $MgAl_2O_4$ single crystal, and $TiO_2$ single crystal.

The substrate may further be provided with a buffer layer.

The magnetoresistive film may further be provided with a cap layer.

The magnetoresistive device may be a CIP (i.e., Current in Plane) type in which a current flows in the in-plane direction of the magnetoresistive film, or a CPP (i.e., Cuttent Perpendicular to Plane) type in which a current flows in the lamination direction of the magnetoresistive film.

In the magnetic sensor provided with a magnetoresistive device according to the present invention, the magnetoresistive device is the above magnetoresistive device, thereby solving the above problems.

In the reproducing head for a magnetic recording and reproducing device provided with a magnetoresistive device according to the present invention, the magnetoresistive device is the above magnetoresistive device, thereby solving the above problems.

In the magnetic recording and reproducing device provided with a reproducing head according to the present invention, the reproducing head is the above reproducing head, thereby solving the above problems.

The magnetic recording and reproducing device may further be provided with a recording head.

Advantageous Effects of Invention

Since the magnetoresistive device of the present invention is provided with a magnetoresistive film provided with at least a pair of ferromagnetic layers and a non-magnetic layer positioned between the pair of ferromagnetic layers, a giant magnetoresistive effect is expected. In addition, each of the pair of ferromagnetic layers is a layer having a body-centered cubic (bcc) crystal structure and being represented by the general formula: $Co_{100-p}Fe_p$ (wherein the parameter p satisfies a value in a range of $0 \leq p \leq 75$, and the ferromagnetic layers constituting the pair have a same value for the parameter p each other or a different value for the parameter p each other), and the non-magnetic layer is a layer having a body-centered cubic (bcc) crystal structure and being composed of Cu. As such, the band structure of electrons with majority spin in the ferromagnetic layer and the band structure of electrons in the non-magnetic layer are well matched at the Fermi level (i.e., $E-E_F=0$). In addition, each of these ferromagnetic layers and non-magnetic layer is a single crystal (001)-oriented layer or is preferentially oriented on a (001) crystal plane. As such, the interface between the ferromagnetic layer and the non-magnetic layer is well matched, so that the transmittance of spin electrons increases at the interface and the MR ratio is remarkably improved.

Such an effect is particularly effective for the CIP type magnetoresistive device, but the similar effect is also expected for the CPP type in addition to the CIP type. Also, the magnetoresistive device of the present invention can be applied to a magnetic sensor, a reproducing head, and a magnetic recording and reproducing device.

DESCRIPTION OF EMBODIMENTS

Hereinafter, embodiments of the present invention will be described with reference to the drawings. Similar constituent elements are numbered in the same way, and explanation thereof will be omitted.

First Embodiment

In a first embodiment, a magnetoresistive device of the present invention and a manufacturing method thereof will be described.

Figure 1:
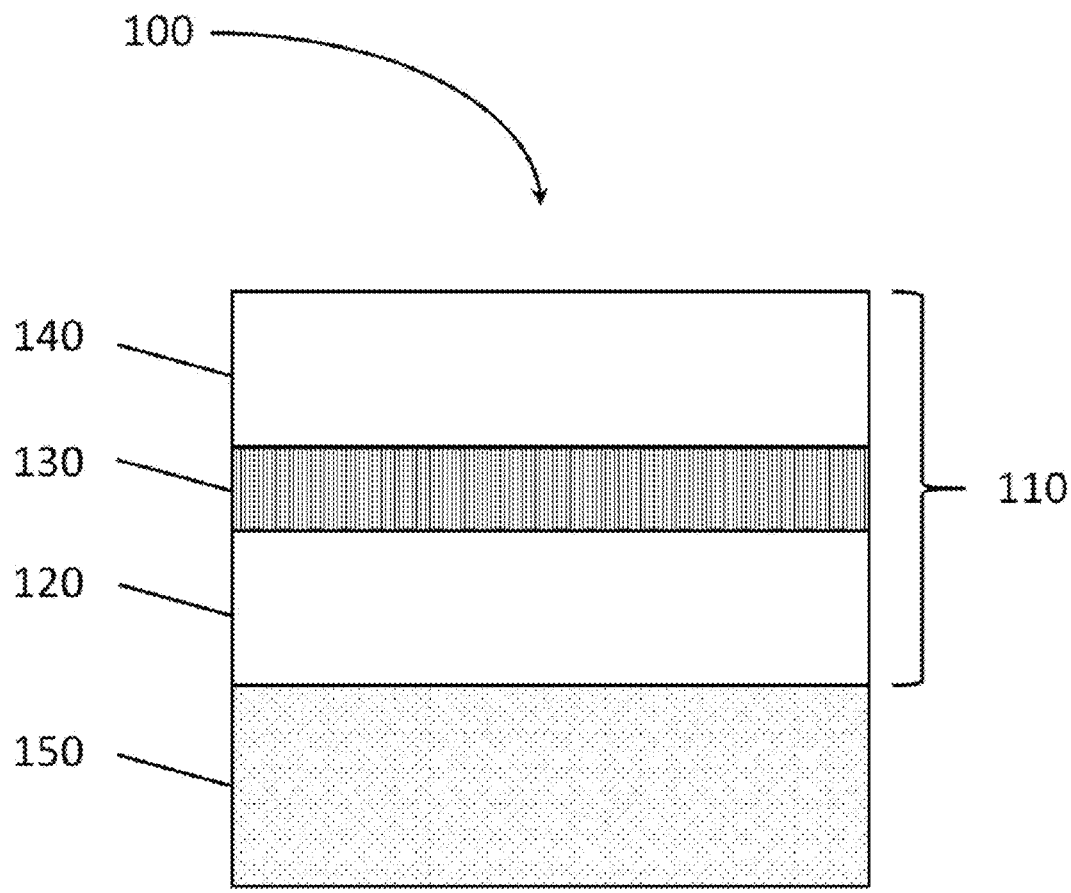
FIG. 1 is a view showing a magnetoresistive device of the present invention.

FIG. 1 is a view showing a magnetoresistive device of the present invention.

A magnetoresistive device 100 of the present invention is provided with a magnetoresistive film 110, and such a magnetoresistive film 110 is provided with at least a pair of ferromagnetic layers 120, 140 and a non-magnetic layer 130 positioned between them. With such a structure, the magnetoresistive device 100 of the present invention exhibits a giant magnetoresistive effect (GMR). FIG. 1 shows the magnetoresistive device 100 provided with a substrate 150 and the magnetoresistive film 110 formed on the substrate 150.

Here, each of the ferromagnetic layers 120, 140 is a layer having a body-centered cubic (bcc) crystal structure and being represented by the general formula: Co$_{100-p}$Fe$_p$ (wherein the parameter p satisfies a value in a range of $0 \leq p \leq 75$, and the ferromagnetic layers 120, 140 constituting the pair may have a same value for the parameter p each other or a different value for the parameter p each other). Hereinafter, for the sake of simplicity, the "layer being represented by the general formula: Co$_{100-p}$Fe$_p$" will be also referred to as a "Co$_{100-p}$Fe$_p$ layer."

It is known that in a binary alloy of Co and Fe, the Co$_{100-p}$Fe$_p$ layer ($20 \leq p \leq 75$) takes a bcc crystal structure from a phase diagram.

On the other hand, in the Co$_{100-p}$Fe$_p$ layer ($0<p<20$), the bcc crystal structure may not be maintained from the phase diagram, but when these layers are grown on a buffer layer (underlayer) having a bcc crystal structure or on a substrate having a bcc crystal structure, a usual fcc crystal structure changes to a bcc crystal structure and can be stabilized.

Alternatively, the Co$_{100-p}$Fe$_p$ layer when p is 0 becomes a Co layer, but according to Shinji Yuasa et al., Applied Physics Letters 89, 04505 (2006), it is shown therein that when grown on a buffer layer (i.e., underlayer) having a bcc crystal structure or a substrate having a bcc crystal structure, Co of which the hexagonal close-packed structure (hcp) is usually stable comes to have a bcc crystal structure.

Further, the inventors of the present application have found that if the band structure of Co when satisfying p=0 in Co$_{100-p}$Fe$_p$ and the band structure of Co$_{100-p}$Fe$_p$ when satisfying $0<p \leq 75$ have a bcc crystal structure, they are well matched to the band structure of Cu having a bcc crystal structure described later at the Fermi level (i.e., E–E$_F$=0). By adopting the Co$_{100-p}$Fe$_p$ layer ($0 \leq p \leq 75$) having a bcc crystal structure to the ferromagnetic layers 120, 140 and a layer composed of Cu having a bcc crystal structure to the non-magnetic layer 130, a magnetoresistive device with an improved MR ratio can be provided. As described later, if p exceeds 75, the band structures are not matched sometimes, and thus it is reasonable that the upper limit of p is 75.

In addition, as described above, the ferromagnetic layers 120, 140 may be Co$_{100-p}$Fe$_p$ layers having the same composition or may be Co$_{100-p}$Fe$_p$ layers having different compositions. The same composition is preferable because the target does not need to be replaced and the manufacturing process is simplified. If the compositions are different, a magnetized antiparallel state due to the difference in coercive force can be obtained. Thus, the different composition is also preferable.

From the viewpoint of band structure matching, the parameter p satisfies preferably a value in a range of $0 \leq p \leq 70$, and more preferably a value in a range of $0 \leq p \leq 65$. As such, the band structures are further matched, so that the MR ratio can be further improved. On the other hand, from the viewpoint of manufacturing efficiency, the parameter p satisfies preferably a value in a range of p=0 or $20 \leq p \leq 75$, more preferably a value in a range of p=0 or $22 \leq p \leq 70$, and still more preferably a value in a range of p=0 or $25 \leq p \leq 65$. Even more preferably, the parameter p satisfies a value in a range of p=0 or $40 \leq p \leq 60$.

The thickness of each of the ferromagnetic layers 120, 140 is not particularly limited, but illustratively it is in the range of 1.5 nm or more and 15 nm or less. In the case where the ferromagnetic layers 120, 140 have a thickness in this range, the ferromagnetic layers 120, 140 can be manufactured with a good control by a physical vapor deposition method or a chemical vapor deposition method.

The non-magnetic layer 130 is a layer composed of Cu having a body-centered cubic (bcc) crystal structure (hereinafter referred to as a Cu layer for simplicity). Usually, Cu has a face-centered cubic (fcc) crystal structure, but as a result of repeating various experiments, the inventors of the present application have found that when the Co$_{100-p}$Fe$_p$ layers ($0 \leq p \leq 75$) having the above bcc crystal structure are used as ferromagnetic layers, the crystal structure of a Cu layer sandwiched between them becomes a bcc crystal structure. Even more surprisingly, the inventors of the present application have found that by adopting a Cu layer having a bcc crystal structure as the non-magnetic layer 130, its band structure is matched to the band structures of the above ferromagnetic layers 120, 140.

The thickness of the non-magnetic layer 130 is not particularly limited as long as it has a bcc crystal structure, but it is preferably in the range of 1.5 nm or more and 5 nm or less. If the thickness is within this range, the non-magnetic layer 130 can be manufactured with a good control by a physical vapor deposition method or a chemical vapor deposition method while maintaining the bcc crystal structure, and further since it becomes a continuous film, magnetic coupling that aligns the magnetization between the ferromagnetic layers 120, 140 in the parallel direction does not appear. More preferably, the thickness of the non-magnetic layer 130 is in the range of 1.8 nm or more and 3 nm or less. Within this range, the amount of current that does not contribute to a magnetoresistive effect flowing inside the non-magnetic layer 130 can be reduced, so that the MR ratio can be improved. Even more preferably, the thickness of the non-magnetic layer 130 is in the range of 1.8 nm or more and 2.5 nm or less. Within this range, the bcc crystal structure of the non-magnetic layer 130 is stabilized, and the interfaces between the non-magnetic layer 130 and the ferromagnetic layers 120, 140 are well lattice-matched, so that the MR ratio can be improved.

Figure 2:
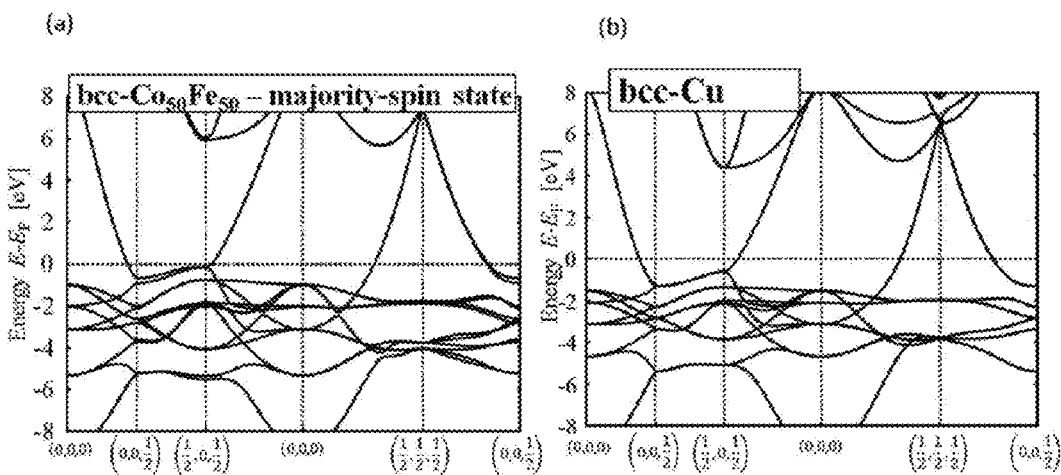
FIG. 2 is graphs showing (a) the band structure of majority-spin electrons in bcc-$Co_{100-p}Fe_p$ (p=50), and (b) the band structure of electrons in bcc-Cu.

FIG. 2 is graphs showing: (a) the band structure of majority-spin electrons in the bcc-$Co_{100-p}Fe_p$ (p=50); and (b) the band structure of electrons in the bcc-Cu.

FIG. 2 shows the band structures obtained from the first-principles calculation. According to FIGS. 2 (a) and (b), it can be understood that the band structure of electrons with majority spin (i.e., up spin) in bcc-$Co_{100-p}Fe_p$ is very similar to the band structure of electrons in bcc-Cu at the Fermi level ($E-E_F=0$). That is, bcc-$Co_{100-p}Fe_p$ and bcc-Cu have the same band structure of electrons, so that majority-spin electrons can be transported through the interface like the same substance even though they are different substances.

Further, each of the ferromagnetic layers 120, 140 and the non-magnetic layer 130 is a single crystal (001)-oriented layer or is preferentially oriented on a (001) crystal plane. As such, the interfaces between the ferromagnetic layers 120, 140 and the non-magnetic layer 130 are well lattice-matched, so that the effect of band structure matching is promoted, and spin electrons are transmitted without being scattered at the interfaces, and the MR ratio can be improved.

In the description of the present application, in the case of a single crystal (001)-oriented layer, each of the ferromagnetic layers 120, 140 and the non-magnetic layer 130 is aligned on the crystal plane of the substrate 150, and it means to be single crystal-like (i.e., an epitaxial film). Whether or not it is such an epitaxial film can be determined by X-ray diffraction, a transmission electron microscope (TEM), or the like. In addition, in the description of the present application, the phrase "is preferentially oriented on a (001) crystal plane" means that in the θ-2θ scan of an X-ray diffraction method, the diffraction peak intensity from a (001) plane having a body-centered cubic (bcc) crystal structure is higher than the diffraction peaks from other crystal planes or means a state in which the diffraction peak from the (001) plane is only observed.

As shown in FIG. 1, the magnetoresistive film 110 may be positioned on the substrate 150. In this case, the substrate is preferably selected from the group consisting of a glass substrate, an alumina substrate, Si single crystal with/without a thermal oxide film, MgO single crystal, sapphire single crystal, $SrTO_3$ single crystal, $MgAl_2O_4$ single crystal, and $TiO_2$ single crystal. When a single crystal substrate is used, a crystal plane has only to be selected on which each of the ferromagnetic layers 120, 140 and the non-magnetic layer 130 is epitaxially grown (i.e., single crystal (001)-oriented layer) or is preferentially oriented on a (001) crystal plane. For example, when the MgO single crystal is selected, an MgO (001) plane is adopted.

In particular, when a $Co_{100-p}Fe_p$ layer (0≤p<20) in which an fcc crystal structure is usually stable is adopted as the ferromagnetic layer 120, it is preferable to proactively adopt the substrate 150 having a bcc crystal structure. As such, the $Co_{100-p}Fe_p$ layer (0≤p<20) changes from an fcc or hcp crystal structure to a bcc crystal structure, and is stabilized.

The substrate 150 may further be provided with a buffer layer (not shown in the figures). As such, even if the mismatch between the substrate 150 and the ferromagnetic layers 120, 140 and the non-magnetic layer 130 is large, or even if the substrate 150 is not a single crystal substrate, these ferromagnetic layers 120, 140 and the non-magnetic layer 130 are epitaxially grown (to be single crystal (001)-oriented layers) or are preferentially oriented on a (001) crystal plane. Examples of such a buffer layer include $Mg_{1-x}Ti_xO$ (0≤x≤0.8), Cr, TiN, and the like, for example.

Alternatively, when a $Co_{100-p}Fe_p$ layer (0<p<20) usually having an fcc crystal structure or Co (p=0) having an hcp crystal structure is adopted as the ferromagnetic layer 120, it is preferable to proactively adopt a buffer layer having a bcc crystal structure. As such a buffer layer, $Co_{100-p}Fe_p$ (20≤p≤100), $Ni_{100-p}Fe_p$ (70≤p≤100), and the like can be adopted. According to the phase diagram, $Co_{100-p}Fe_p$ (20≤p≤100) has a bcc crystal structure, and thus if a $Co_{100-p}Fe_p$ layer (0≤p<20) is formed thereon, the fcc or hcp crystal structure changes to a bcc crystal structure, and is stabilized.

It can be understood by those skilled in the art that since the ferromagnetic layer 140 is positioned on the non-magnetic layer 130 that is a layer composed of Cu having a bcc crystal structure, as described later, the $Co_{100-p}Fe_p$ layer (0≤p≤75) having a bcc crystal structure is stabilized by using the non-magnetic layer 130 as the buffer layer.

In order to obtain a large MR ratio, it is necessary that the magnetization of the ferromagnetic layers 120, 140 is oriented in a completely antiparallel state in a certain magnetic field region. In order to achieve it, materials having different coercive forces may be used for the ferromagnetic layers 120, 140, an exchange bias may be applied to a structure provided with an antiferromagnetic layer 320 shown in FIG. 3, or the ferromagnetic layers 120, 140 may obtain antiferromagnetic interlayer exchange interactions via the non-magnetic layer 130. Here, if the magnetoresistive film 110 of the present invention is adopted, an interlayer exchange interaction can be obtained. Also, when the artificial lattice structure shown in FIG. 4 is formed by repeating the laminated structure shown in FIG. 1, antiparallel coupling continues indefinitely in the lamination direction and a state in which the magnetization of adjacent ferromagnetic layers is always antiparallel can be created. As such, the realization of a large MR ratio can be expected.

When the difference of coercive force values between the ferromagnetic layers 120, 140 is provided, that may be realized by controlling the composition of the $Co_{100-p}Fe_p$ layer constituting each of the ferromagnetic layers (i.e., the value of the parameter p), for example.

In FIG. 1, the magnetoresistive film 110 has a set of multilayer structure of a pair of the ferromagnetic layers 120, 140 and the non-magnetic layer 130 positioned between them, but the set of such multilayer structure may be provided in two or more sets. In this case, each multiple structure of the two or more sets is separated by an insulating layer (i.e., barrier layer). With such a structure, the MR ratio can be increased. In this case, examples of the insulating layer include MgO, AO, and the like. The thickness of the insulating layer is preferably 0.2 nm or more and 3 nm or less.

In the magnetoresistive device 100, the magnetoresistive film 110 may further be provided with a cap layer (not shown in the figures) on the ferromagnetic layer 140. The cap layer can function as a protective layer for the surface of the magnetoresistive film 110. Examples of such a cap layer include, for example, tantalum (Ta), gold (Au), aluminum (Al), ruthenium (Ru), platinum (Pt), and the like. The thickness of the cap layer is preferably 0.5 nm or more and 2 nm or less.

Figure 3:
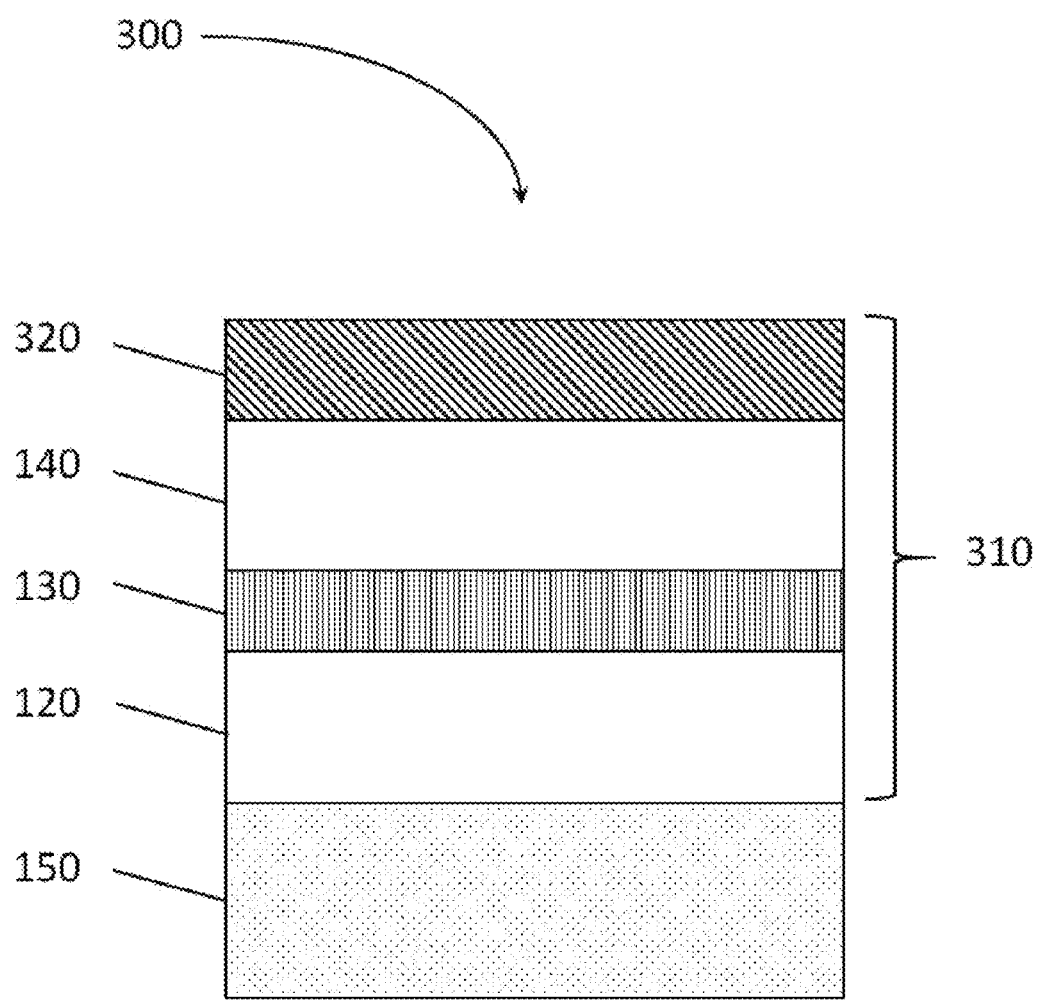
FIG. 3 is a view showing a magnetoresistive device 300 according to another embodiment of the present invention.
Figure 4:
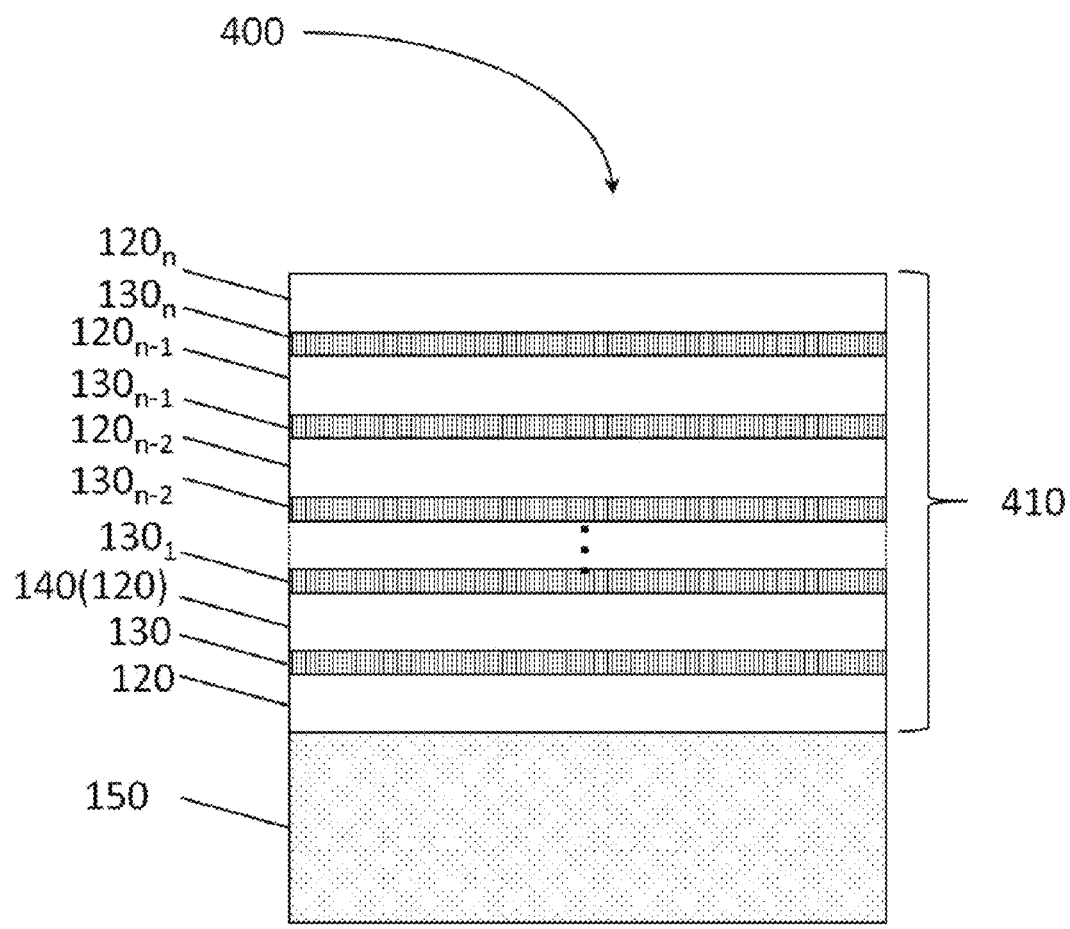
FIG. 4 is a view showing a magnetoresistive device 400 according to still another embodiment of the present invention.

FIG. 3 is a view showing a magnetoresistive device 300 according to another embodiment of the present invention.

The magnetoresistive device 300 is different from the magnetoresistive device 100 in FIG. 1 in that a magnetoresistive film 310 is provided with an antiferromagnetic layer 320 that is magnetically coupled to either ferromagnetic layer 140 of the pair of ferromagnetic layers 120, 140. Constituent elements similar to those in FIG. 1 are numbered in the same way, and explanation thereof will be omitted. With such a structure, the magnetoresistive film 310 is called a spin valve in which the ferromagnetic layer 120 becomes a free layer and the ferromagnetic layer 140 and the antiferromagnetic layer 320 function as pin layers. And, by changing the direction of the magnetization of the free layer, a giant magnetoresistive effect can be exhibited.

As such an antiferromagnetic layer 320, an antiferromagnetic layer generally used in the technical field of the art is adopted, and illustratively it is selected from the group consisting of an IrMn layer, an FeMn layer, a PtMn layer, and a CoO layer. Also, the thickness of the antiferromagnetic layer 320 is preferably 1 nm or more and 10 nm or less.

In FIG. 3, the magnetoresistive film 310 has a set of multilayer structure composed of the ferromagnetic layer 120, the non-magnetic layer 130, the ferromagnetic layer 140, and the antiferromagnetic layer 320, but the set of such a multilayer structure may be provided in two or more sets, as is the case with the magnetoresistive film 110. In this case, each multiple structure of the two or more sets is separated by an insulating layer. With such a structure, the MR ratio can be increased. The insulating layer is as described above.

Alternatively, the magnetoresistive film 310 may have two or more of the multilayer structures, each of which is composed of the ferromagnetic layer 120, the non-magnetic layer 130, the ferromagnetic layer 140, and the antiferromagnetic layer 320 so as to share the ferromagnetic layer 120 that is a free layer. Such a structure is called a dual spin valve type magnetoresistive device.

The magnetoresistive film 310 in FIG. 3 may be provided with a cap layer (not shown in the figures) on the antiferromagnetic layer 320, as is the case with the magnetoresistive film 110 in FIG. 1. The cap layer is as described above.

FIG. 4 is a view showing a magnetoresistive device 400 according to still another embodiment of the present invention.

The magnetoresistive device 400 is different from the magnetoresistive device 100 in FIG. 1 and the magnetoresistive device 300 in FIG. 3 in that a magnetoresistive film 410 has an artificial lattice structure in which ferromagnetic layers $120_{1\ to\ n}$ and non-magnetic layers $130_{1\ to\ n}$ are alternately and repeatedly laminated in addition to the multilayer structure composed of the pair of ferromagnetic layers 120, 140 and the non-magnetic layer 130 positioned between them. Here, constituent elements similar to those in FIG. 1 are numbered in the same way, and explanation thereof will be omitted. With such a structure, the magnetoresistive film 410 can exhibit a giant magnetoresistive effect. The number "n" of repetitions in this case is not particularly limited, but illustratively it is in the range of 2 or more and 100 or less.

The magnetoresistive film 410 in FIG. 4 may be provided with a cap layer (not shown in the figures) or an antiferromagnetic layer (not shown in the figures) on the ferromagnetic layer 120, as is the case with the magnetoresistive film 110 in FIG. 1 and the magnetoresistive film 310 in FIG. 3. The cap layer and the antiferromagnetic layer are as described above.

Also, when the magnetoresistive film 410 has an artificial lattice structure, the ferromagnetic layers $120_{1\ to\ n}$ realize antiparallel interlayer magnetic coupling (i.e., interlayer exchange interaction) with the magnetization of the ferromagnetic layer adjacent across the non-magnetic layer 130. As such, an antiparallel state of magnetization is obtained, so that the MR ratio can be increased.

When used particularly as CIP (Current in Plane) type magnetoresistive devices in which a current flows in the in-plane directions of the magnetoresistive films 110, 310, 410, the magnetoresistive devices 100, 300, 400 of the present invention exhibit a large MR ratio, which is preferable. However, there is no problem even when the magnetoresistive devices 100, 300, 400 of the present invention are used as CPP (Current Perpendicular to Plane) type magnetoresistive devices in which a current flows in the lamination directions of the magnetoresistive films 110, 310, 410.

Also, in the magnetoresistive devices 100, 300, 400 of the present invention, the magnetoresistive films 110, 310, 410 may be provided with a buffer layer, a reference layer, a barrier layer, or the like, if necessary.

An exemplary manufacturing method of the magnetoresistive device 100 of the present invention is as follows. In the basic manufacturing process, the ferromagnetic layer 120, the non-magnetic layer 130, and the ferromagnetic layer 140 are sequentially formed on the substrate 150. If necessary, a buffer layer, a cap layer, a shield layer, a reference layer, a barrier layer, or the like may be formed. For example, when the antiferromagnetic layer 320 (see FIG. 3) is formed, the magnetoresistive device 300 is manufactured, and when the ferromagnetic layer and the non-magnetic layer are repeatedly laminated, the magnetoresistive device 400 is manufactured. It is known in the technical field of the art that these layers can be formed into a film by a physical vapor deposition method or a chemical vapor deposition method, and a physical vapor deposition method represented by a sputtering method is preferably adopted. Following the film formation, physical or chemical etching or photolithography is performed and microfabrication is performed to obtain a magnetoresistive device. As for an exemplary manufacturing method, "Examples" described later should be referred to.

Second Embodiment

In a second embodiment, applications in which the magnetoresistive devices of the present invention described in the first embodiment are used will be described.

Figure 5:
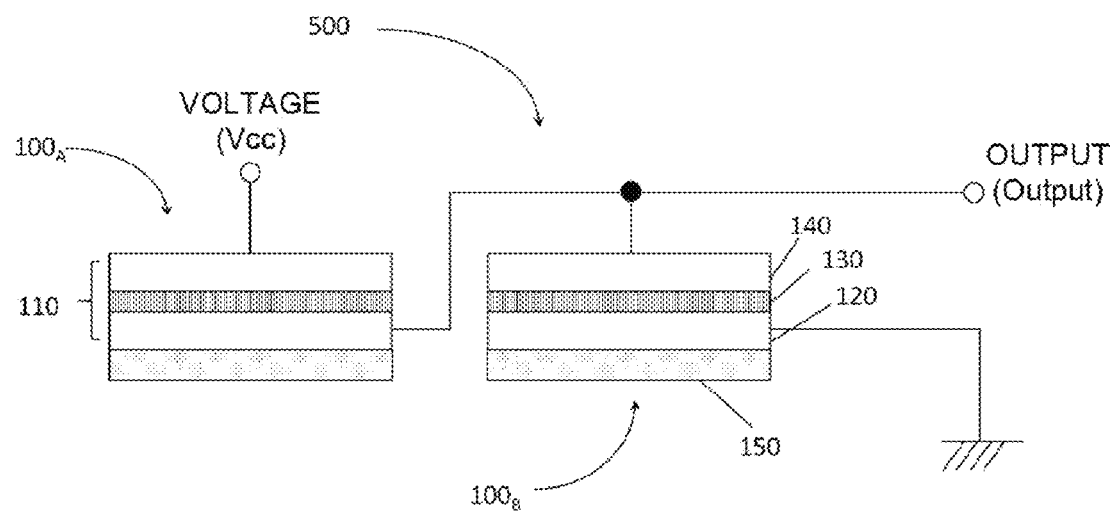
FIG. 5 is a view showing a magnetic sensor of the present invention.

FIG. 5 is a view showing a magnetic sensor of the present invention.

A magnetic sensor 500 of the present invention is provided with magnetoresistive devices $100_A$, $100_B$ as the magnetoresistive device 100 explained with reference to FIG. 1. In FIG. 5, two magnetoresistive devices $100_A$, $100_B$ are connected, but the number of these devices is not limited to two. A voltage Vcc is applied between the ferromagnetic layer 140 of the magnetoresistive device $100_A$ and the ferromagnetic layer 120 of the magnetoresistive device $100_B$. The voltage between the ferromagnetic layer 120 of the magnetoresistive device $100_A$ and the ferromagnetic layer 140 of the magnetoresistive device $100_B$ is measured. Also, the magnetoresistive device 100 shown in FIG. 1 is used as the magnetic sensor 500, but instead of the magnetoresistive device 100 in FIG. 1, the magnetoresistive device 300 in FIG. 3, the magnetoresistive device 400 in FIG. 4, or a combination of these may be used as the magnetic sensor 500.

Also, by providing a calculation circuit (not shown in the figures) that performs a predetermined calculation based on the output voltage of the magnetic sensor 500 in order to acquire magnetic information and a display unit (not shown in the figures) that displays the obtained magnetic information, a magnetic detector may be realized.

Figure 6A:
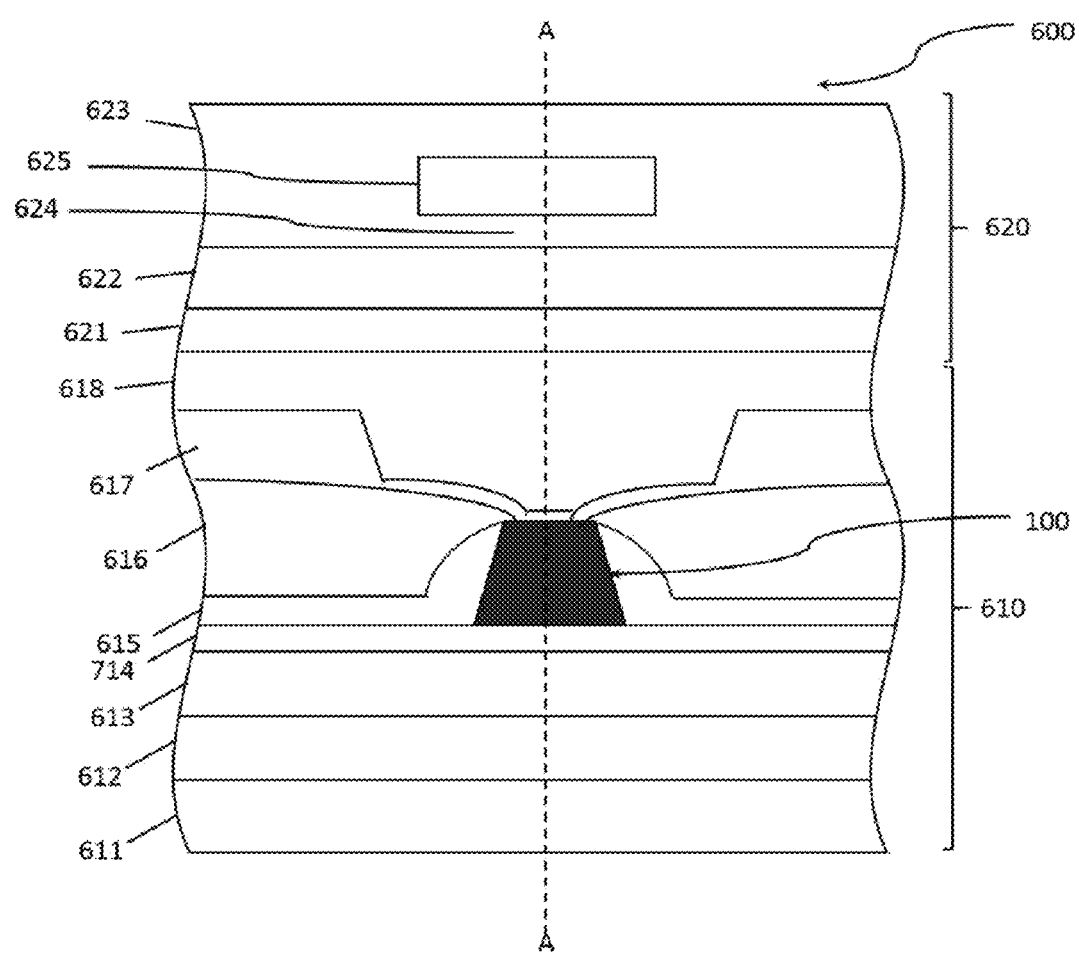
FIG. 6A is a view showing a magnetic head in which a reproducing head of the present invention and a recording head are combined.

FIG. 6A is a view showing a magnetic head in which the reproducing head of the present invention and a recording head are combined.

Figure 6B:
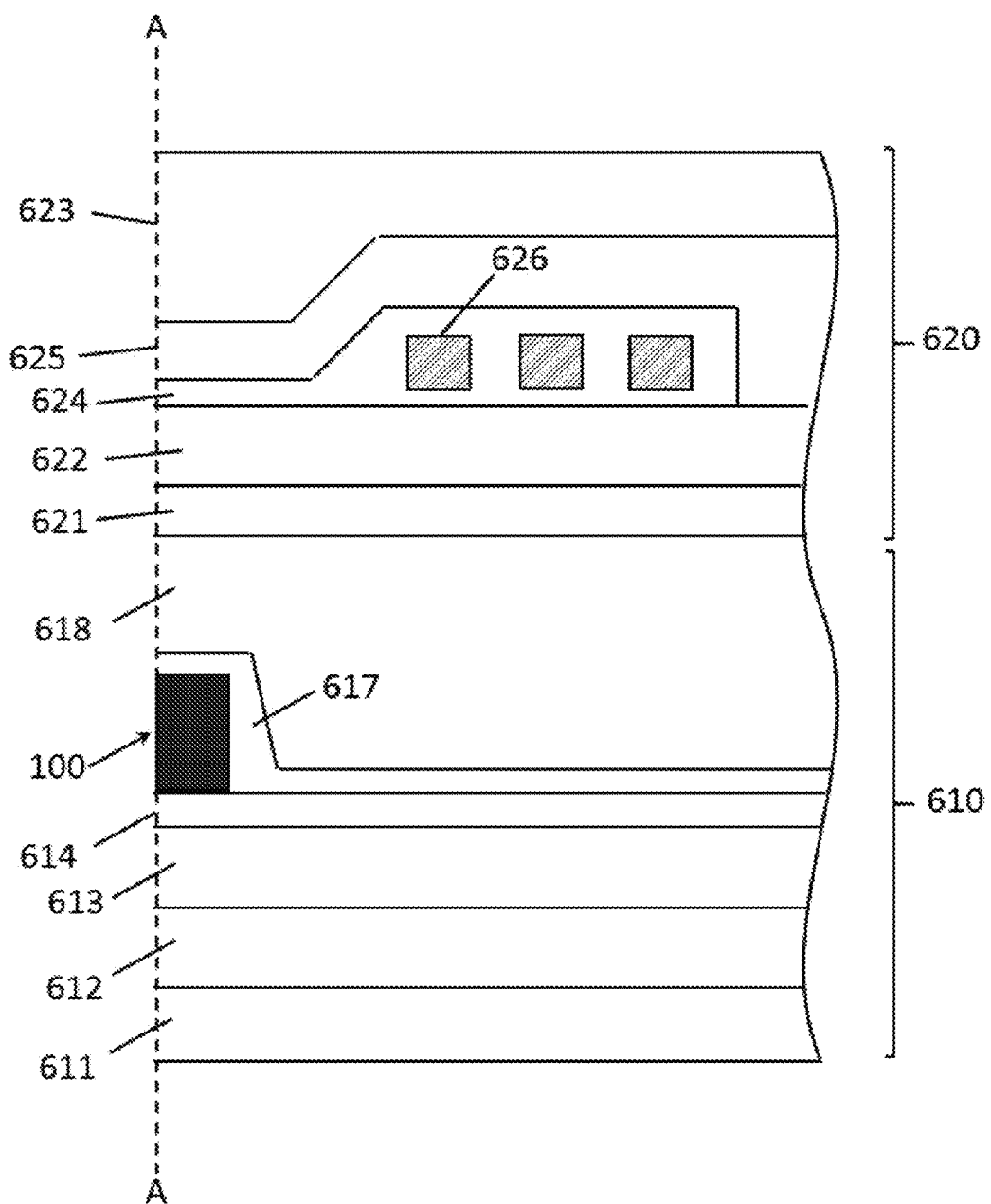
FIG. 6B is a sectional view taken along the line A-A shown in FIG. 6A.

FIG. 6B is a sectional view taken along the line A-A shown in FIG. 6A.

As shown in FIG. 6A, a magnetic head 600 is provided with a reproducing head 610 of the present invention and a recording head 620. The structure of a flying surface is shown. In FIG. 6A, the vertical direction of the paper surface is the moving direction of a magnetic recording medium (not shown in the figures), and the horizontal direction of the paper surface corresponds to the width direction of a track formed on the magnetic recording medium. FIG. 6B shows the cross section, in the plane direction perpendicular to the line A-A, of the magnetic head 600.

The reproducing head 610 of the present invention may be provided with at least the magnetoresistive device 100, but in FIG. 6A, an insulating layer 612, a lower shield layer 613, a lower gap insulating layer 614, the magnetoresistive device 100, a pair of terminal layers 616, magnetic domain control layers 615 on both sides of the magnetoresistive device 100, an upper gap insulating layer 617, and an upper shield layer 618 are further provided on a flat slider 611.

The recording head 620 is provided on the reproducing head 610 via an insulating layer 621, and is provided with an upper magnetic pole 625 having a width usually corresponding to the track of the magnetic recording medium on the side facing a lower magnetic pole 622 with the lower magnetic pole 622 and a recording gap layer 624 interposed therebetween. These are covered with an insulating layer 623. Also, as shown in FIG. 6B, the recording head 620 is provided with a yoke that connects the lower magnetic pole 622 and the upper magnetic pole 625, and a coil 626 wound around the yoke. The materials of the insulating layer, shield layer, yoke, coil, magnetic pole, terminal, magnetic domain control layer, and the like, which are illustratively shown in FIG. 6A and FIG. 6B, are not particularly limited as long as they are usually used in the technical field of the art.

With such a configuration, the magnetic head 600 records information on the magnetic recording media facing each other by a recording magnetic field leaking from the lower magnetic pole 622 and the upper magnetic pole 625 of the recording head 620. The magnetoresistive device 100 of the reproducing head 610 detects, as a resistance change, the leakage magnetic field from the magnetic recording medium corresponding to the recorded information. In detail, in the reproducing head 610, a sense current for detecting the resistance change flows from the pair of terminal layers 616 in the in-plane direction of the magnetoresistive film of the magnetoresistive device 100, and is drawn out from the other terminal layer 616. The change in the leakage magnetic field from the magnetic recording medium is detected by the voltage across the magnetoresistive device 100 generated when the sense current flows, via the change in the electric resistance value in the width direction of the magnetoresistive device 100.

FIG. 6A and FIG. 6B show the magnetic head 600 of composite type provided with the reproducing head 610 and the recording head 620, but it may be configured as a magnetic head provided only with the reproducing head 610. As the magnetoresistive device 100, of course, the magnetoresistive devices 300, 400 may be used.

Figure 7:
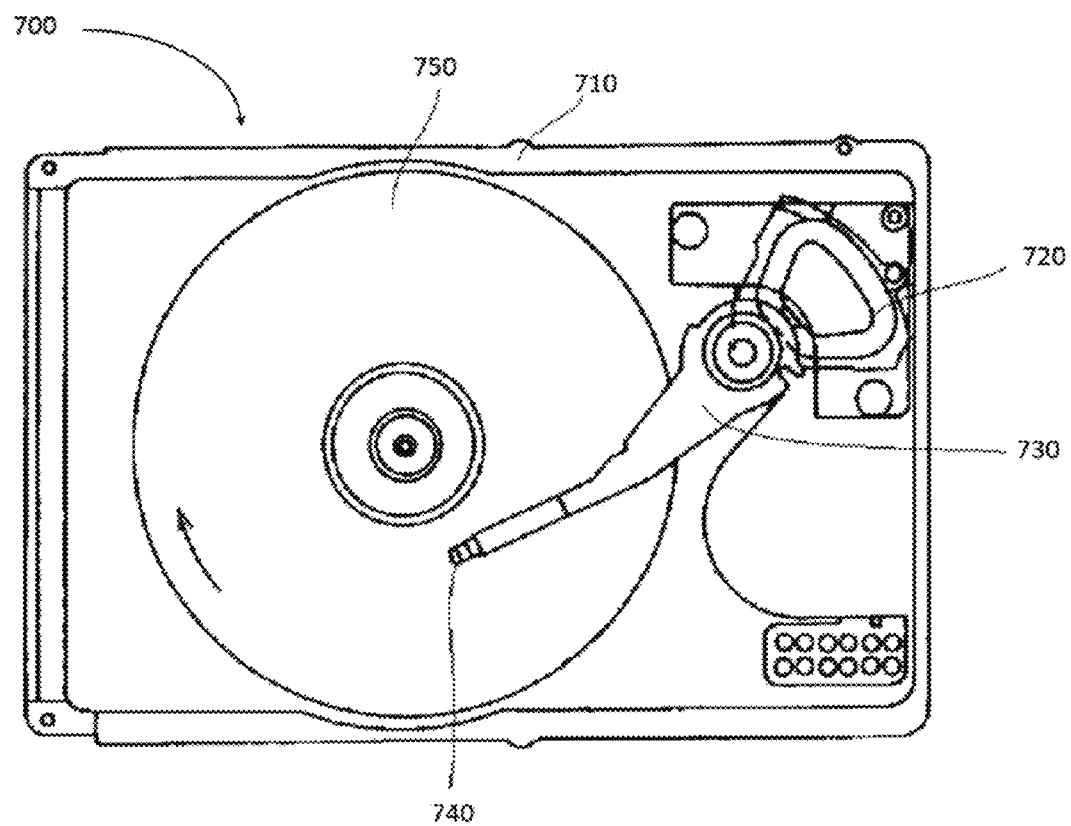
FIG. 7 is a view showing a magnetic recording and reproducing device of the present invention.

FIG. 7 is a view showing a magnetic recording and reproducing device of the present invention.

A magnetic recording and reproducing device 700 is provided with, in a rectangular housing 710, an actuator 720, an actuator arm 730 attached to this, a head slider 740 attached to the tip of the actuator arm 730, and a magnetic recording medium 750.

To the head slider 740 that records and reproduces the information to be stored in the magnetic recording medium 750, at least the reproducing head 610 of the present invention explained with reference to FIG. 6A and FIG. 6B is attached.

The magnetic recording medium 750 is rotated in the direction of the arrow by a motor that responds to a control signal from the controller (not shown in the figures) of a drive unit. When the magnetic recording medium 750 is rotated, the medium-facing surface of the head slider 740 is maintained at a predetermined flying amount from the surface of the magnetic recording medium 750 or comes into contact with the surface.

In the present invention, the reproducing head 610 using the above magnetoresistive device of the present invention is adopted, so that noise can be reduced and signals can be stably recorded and reproduced.

Of course, instead of the reproducing head 610, the magnetic head 600 of composite type provided with the recording head 620 may be used. In addition, the magnetic recording medium 750 is not limited to a magnetic disk.

Next, the present invention will be described in detail with reference to specific examples, but it should be noted that the present invention is not limited to these examples.

EXAMPLES

Example 1 to Example 9

In each of Example 1 to Example 9, a magnetoresistive device was manufactured on an MgO (001) single crystal substrate or a c-Si (001) single crystal substrate with a thermal oxide film ($SiO_x$) by using a $Co_{100-p}Fe_p$ layer as a ferromagnetic layer and a Cu layer or an Ag layer as a non-magnetic layer.

In detail, under the conditions shown in Table 1, on the substrate were formed each of the following magnetoresistive devices: in each of Example 1 to Example 7, a spin valve type magnetoresistive device in which $Co_{100-p}Fe_p$ (6 nm)/Cu or Ag (0 to 5 nm gradient film)/$Co_{100-p}Fe_p$ (6 nm)/IrMn (8 nm)/Ta (3 nm); in Example 8, a dual spin valve type magnetoresistive device in which IrMn (8 nm)/$Co_{100-p}Fe_p$ (6 nm)/Cu (0 to 5 nm gradient film)/$Co_{100-p}Fe_p$ (6 nm)/Cu (0 to 5 nm gradient film)/$Co_{100-p}Fe_p$ (6 nm)/IrMn (8 nm); and in Example 9, an interlayer exchange interaction type magnetoresistive device in which $Co_{100-p}Fe_p$ (6 nm)/Cu (1.87 nm)/$Co_{100-p}Fe_p$ (6 nm)/MgO (3 nm). The film thickness dependence of each non-magnetic layer of Example 1 to Example 8, which was made to have a wedge structure of a gradient film with a thickness of 0 nm to 5 nm was investigated.

TABLE 1

List of Samples of Example 1 to Example 9

| Example | Magnetoresistive Device Type | Ferromagnetic Layer ($Co_{100-p}Fe_p$) P | Thickness (nm) | Non-Magnetic Layer Cu/Ag | Thickness (nm) | Substrate | Antiferromagnetic Layer IrMn Thickness (nm) | Cap Layer Ta/MgO | Thickness (nm) |
|---|---|---|---|---|---|---|---|---|---|
| 1 | Spin Valve | 10 | 6 | Cu | 0~5 | MgO(001) | 8 | Ta | 3 |
| 2 | Spin Valve | 25 | 6 | Cu | 0~5 | MgO(001) | 8 | Ta | 3 |
| 3 | Spin Valve | 50 | 6 | Cu | 0~5 | MgO(001) | 8 | Ta | 3 |
| 4 | Spin Valve | 67 | 6 | Cu | 0~5 | MgO(001) | 8 | Ta | 3 |
| 5 | Spin Valve | 100 | 6 | Cu | 0~5 | MgO(001) | 8 | Ta | 3 |
| 6 | Spin Valve | 50 | 6 | Cu | 0~5 | $SiO_x$/c-Si(001) | 8 | Ta | 3 |
| 7 | Spin Valve | 50 | 6 | Ag | 0~5 | MgO(001) | 8 | Ta | 3 |
| 8 | Dual Spin Valve | 50 | 6 | Cu | 0~5 | MgO(001) | 8 | — | — |
| 9 | Interlayer Exchange Interaction | 50 | 6 | Cu | 1.87 | MgO(001) | — | MgO | 3 |

Each target of $Co_{100-p}Fe_p$ having various compositions, Cu, Ag, IrMn, and Ta, the target was set in DC-RF magnetron sputter (manufactured by Eiko Corporation, model number ESA-0788), and sputtering was performed under the sputtering conditions shown in Table 2. Then, under the annealing conditions shown in Table 2, the samples of Example 1 to Example 9 were heat-treated in a magnetic field to give one-way magnetic anisotropy. The samples of Example 1 to Example 9 were processed into wires by photolithography. In preliminary experiments, it has been confirmed that the composition of a target and the composition of a ferromagnetic layer becomes substantially the same by composition analysis. Therefore, in the present application, the composition used as a target is equated with the composition of the obtained ferromagnetic layer.

TABLE 2

Sputtering Conditions and Annealing Conditions for Samples of Example 1 to Example 9

| Target | Ferromagnetic Layer $Co_{100-p}Fe_p$ | Non-Magnetic Layer Cu/Ag | Antiferromagnetic Layer IrMn | Cap Layer Ta | Cap Layer MgO |
|---|---|---|---|---|---|
| Pressure (Pa) | <5 × 10$^{-7}$ | <5 × 10$^{-7}$ | <5 × 10$^{-7}$ | <5 × 10$^{-7}$ | <5 × 10$^{-7}$ |
| Substrate Temperature (° C.) | Room Temperature | Room Temperature | Room Temperature | Room Temperature | Room Temperature |
| Sputtering Power (W) | DC20 | RF30 | DC20 | DC20 | DC20 |
| Sputtering Time (S) | 120-180 | 0-130 | 55 | 45 | 45 |
| Film Thickness (nm) | 6 | 0-5 (Gradient Film) | 8 | 3 | 3 |
| Annealing Treatment Conditions | 250° C. for 1 Hour in 3kOe | | | | |

The structures of the samples of Example 1 to Example 9 thus obtained are summarized in Table 3 for simplicity.

TABLE 3

List of Magnetoresistive Element Structures of Example 1 to Example 9

| Example | Magnetoresistive Element Structure |
|---|---|
| 1 | MgO/$Co_{90}Fe_{10}$/Cu/$Co_{90}Fe_{10}$/IrMn/Ta |
| 2 | MgO/$Co_{75}Fe_{25}$/Cu/$Co_{75}Fe_{25}$/IrMn/Ta |
| 3 | MgO/$Co_{50}Fe_{50}$/Cu/$Co_{50}Fe_{50}$/IrMn/Ta |
| 4 | MgO/$Co_{33}Fe_{67}$/Cu/$Co_{33}Fe_{67}$/IrMn/Ta |
| 5 | MgO/Fe/Cu/Fe/IrMn/Ta |
| 6 | c-Si/$SiO_x$/$Co_{50}Fe_{50}$/Cu/$Co_{50}Fe_{50}$/IrMn/Ta |
| 7 | MgO/$Co_{50}Fe_{50}$/Ag/$Co_{50}Fe_{50}$/IrMn/Ta |
| 8 | MgO/IrMn/$Co_{50}Fe_{50}$/Cu/$Co_{50}Fe_{50}$/Cu/$Co_{50}Fe_{50}$/IrMn |
| 9 | MgO/$Co_{50}Fe_{50}$/Cu/$Co_{50}Fe_{50}$/MgO |

Figure 8:
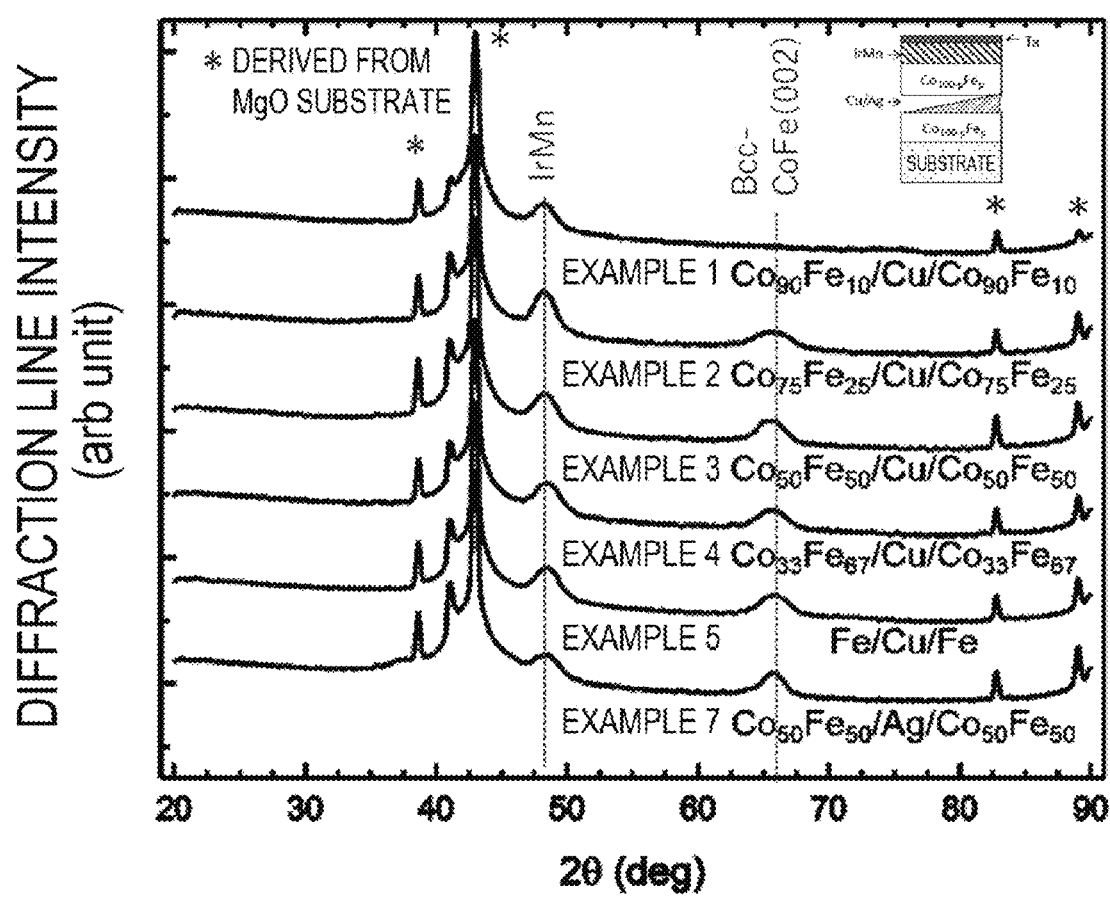
FIG. 8 is a graph showing XRD patterns of the samples of Example 1 to Example 5 and Example 7.

X-ray diffraction was performed on the samples of Example 1 to Example 9. The results are shown in FIG. 8.

Figure 9:
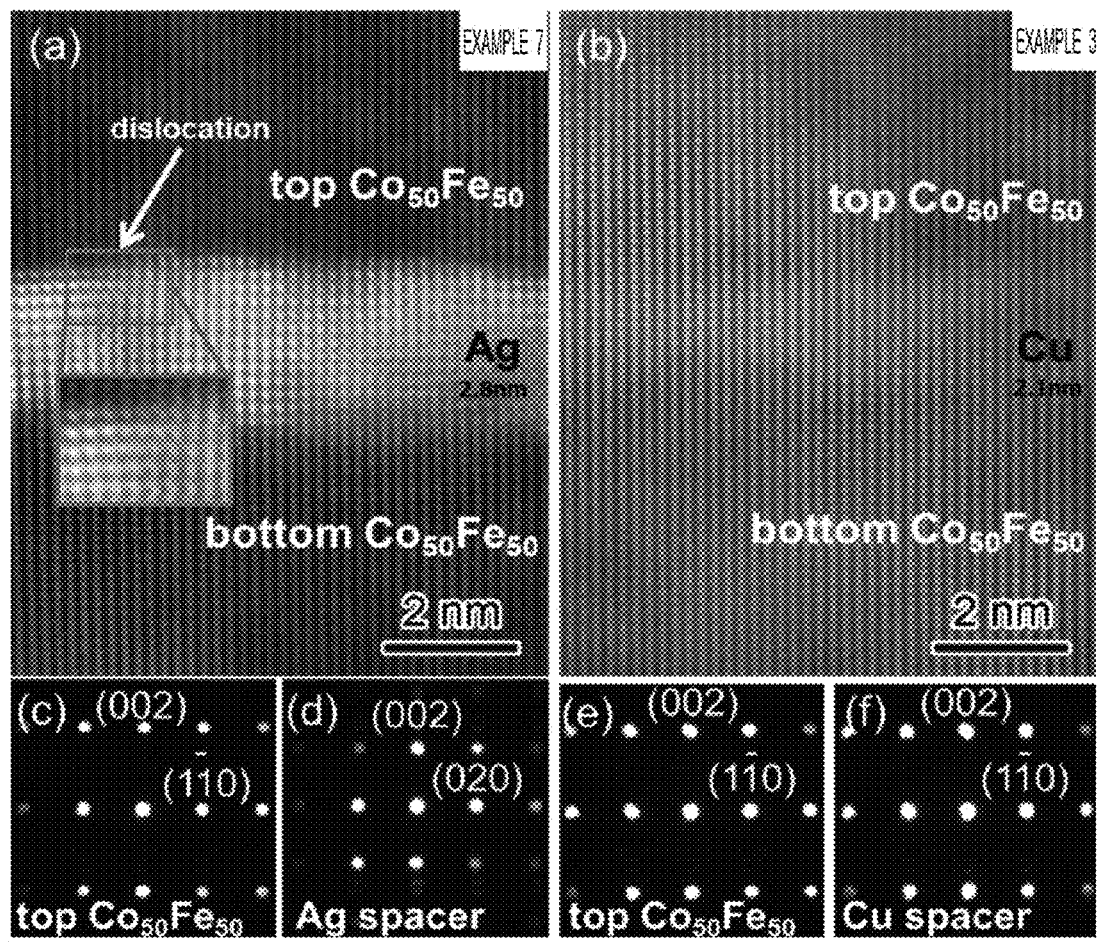
FIG. 9 is images showing the HAADF-STEM images and electron diffraction patterns of the samples of Example 7 and Example 3 (wherein: (a) and (b) are images showing the HAADF-STEM images of Example 7 and Example 3, respectively; (c), (d) and (e), (f) are images showing the electron diffraction patterns of Example 7 and Example 3, respectively).
Figure 10:
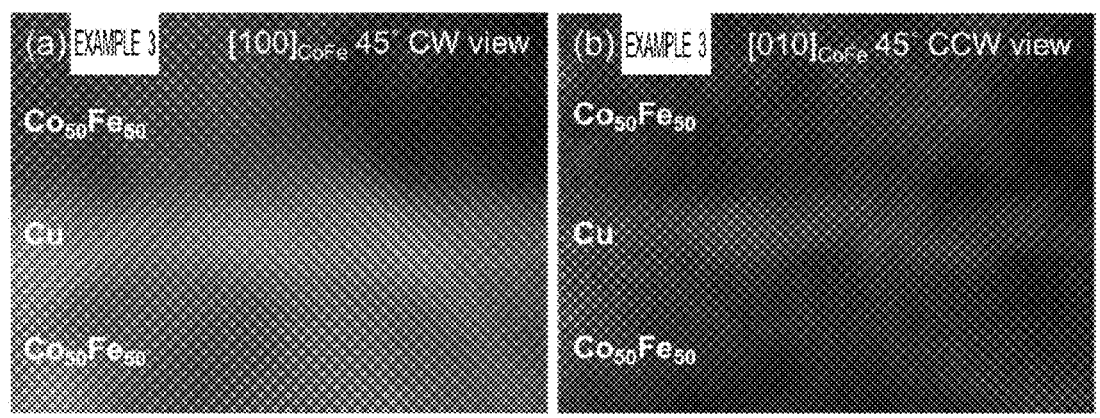
FIG. 10 is images showing the HAADF-STEM images of the sample of Example 3, taken from different crystal zone axes (wherein: (a) is an image showing a HAADF-STEM image taken from the $Co_{50}Fe_{50}$ [100] crystal zone axis when rotated 45° clockwise from FIG. 9(b); (b) is an image showing a HAADF-STEM image taken from the $Co_{50}Fe_{50}$ [010] crystal zone axis when rotated 45° counterclockwise from FIG. 9(b)).
Figure 11:
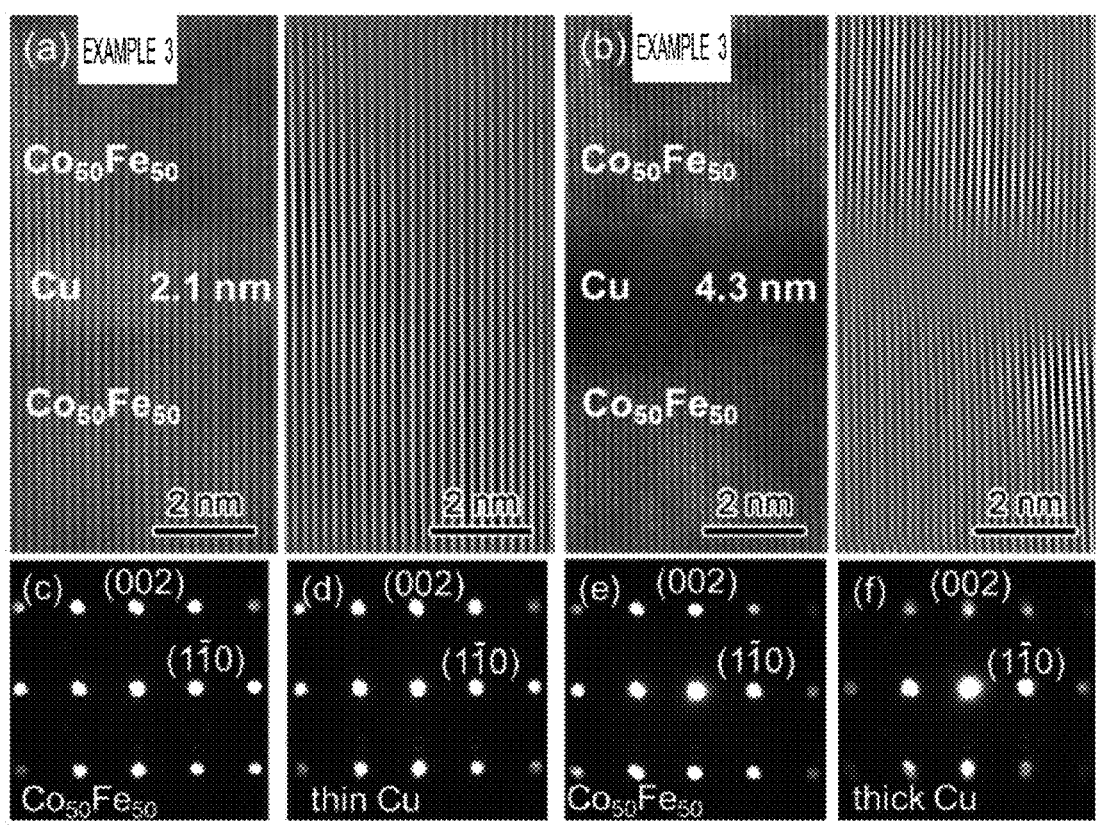
FIG. 11 is images showing the HAADF-STEM images, inverse Fourier transform (i.e., IFFT) images, and electron diffraction patterns of the Cu layers having different thicknesses in the sample of Example 3 (wherein: (a) and (c), (d) show the HAADF-STEM image and electron diffraction patterns of the Cu layer having a thickness of 2.1 nm, respectively; (b) and (e), (f) show the HAADF-STEM image and electron diffraction patterns of the Cu layer having a thickness of 4.3 nm, respectively).

The samples of Example 1 to Example 9 were subjected to high resolution observation by high-angle scattering darkfield scanning transmission electron microscopy (HAADF-STEM method) using a transmission electron microscope (TEM, manufactured by FEI Co., model number TITAN G2-200). As such, electron diffraction patterns were obtained. The results are shown in FIGS. 9 to 11.

The magnetic properties of the samples of Example 1 to Example 9 were measured using the four-probe method. In detail, at room temperature (25° C.), a current flew in the in-plane direction of a film, an external magnetic field was applied in the direction parallel to its direction, and the change in resistance value at that time was measured, thereby obtaining the MR ratio. Also, as for the samples of Example 3 and Example 7, the temperature dependences of MR ratio, resistance (R), and resistance change (dR) were investigated. As for the sample of Example 8, the bias voltage dependence of MR ratio was investigated. As for the sample of Example 9, the external magnetic field dependence of resistance value was investigated. These results are shown in FIGS. 12 to 19.

Figure 20:
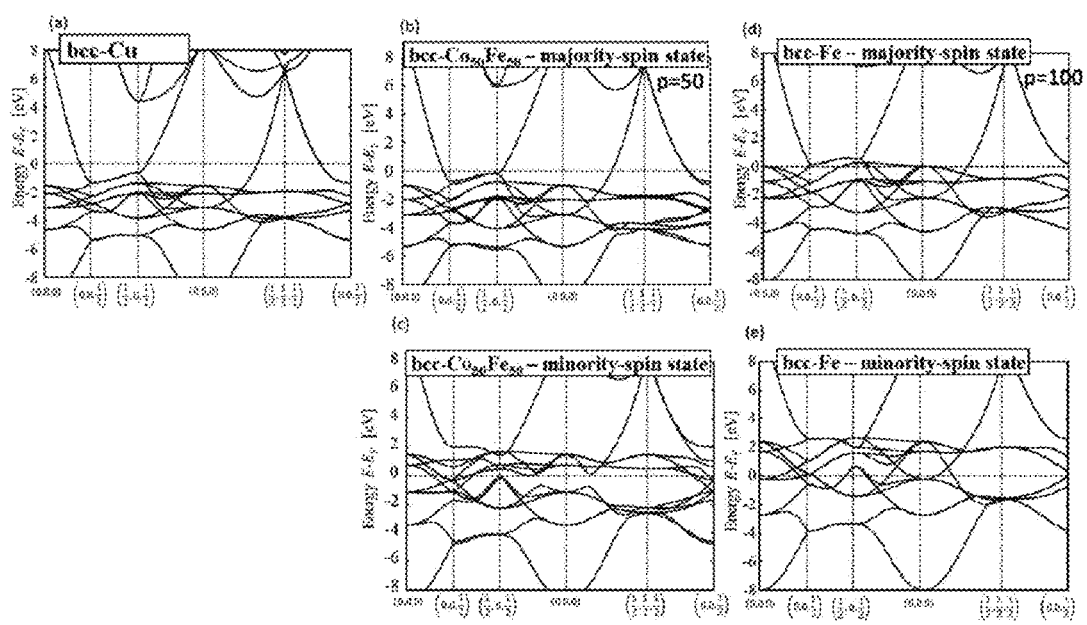
FIG. 20 is graphs showing the band structures of (a) bcc-Cu, (b) bcc-Co$_{50}$Fe$_{50}$, (c) bcc-Co$_{50}$Fe$_{50}$, (d) bcc-Fe, and (e) bcc-Fe by the first-principles calculation.
Figure 21:
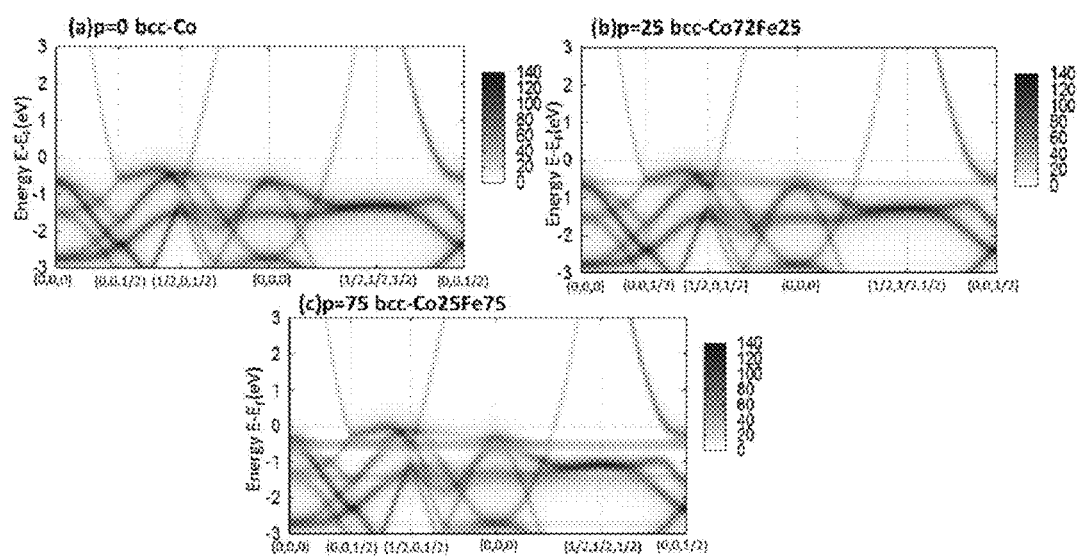
FIG. 21 is graphs showing the band structures of (a) bcc-Co, (b) bcc-Co$_{75}$Fe$_{25}$, and (c) bcc-Co$_{25}$Fe$_{75}$ by the first-principles calculation.

The first-principles calculation was performed on bcc-Cu and $Co_{100-p}Fe_p$ (p=0, 25, 50, 75, 100) to determine the band structures. The results are shown in FIG. 20 and FIG. 21.

The above results will be described together.

FIG. 8 is a graph showing XRD patterns of the samples of Example 1 to Example 5 and Example 7.

It has been confirmed that in every sample, a peak appears near about 48°, which is identified as the (002) peak of IrMn, and every sample is an epitaxial film. It has been confirmed that in the samples of Example 2 to Example 5 and Example 7, a peak appears at about 66°, and thus is identified as a peak due to (002) bcc crystal structure. On the other hand, it has been confirmed that this peak is not observed for the sample of Example 1. It has been found from this that the $Co_{90}Fe_{10}$ in the sample of Example 1 has an fcc crystal structure, and the $Co_{100-p}Fe_p$ (p=25, 50, 67, 100) in each sample of Example 2 to Example 5 and Example 7 has a bcc crystal structure. Although not shown in the figures, it has been confirmed that the samples of Example 8 and Example 9 also show the same XRD pattern as of Example 3.

FIG. 9 is images showing the HAADF-STEM images and electron diffraction patterns of the samples of Example 7 and Example 3.

FIG. 10 is images showing the HAADF-STEM images of the sample of Example 3, taken from different crystal zone axes from that of FIG. 9.

FIG. 11 is images showing the HAADF-STEM images, inverse Fourier Transform (IFFT) images, and electron diffraction patterns of Cu layers having different thicknesses in the sample of Example 3.

FIGS. 9 (a) and (b) show the atomic resolution HAADF-STEM images of the cross sections of the samples of Example 7 and Example 3, respectively. Both images were taken from the [110] crystal zone axis of the $Co_{50}Fe_{50}$ layer. And, it has been confirmed that the thicknesses of the Ag layer and Cu layer are 2.8 nm and 2.1 nm, respectively. Both images indicate that it was epitaxially grown, but when focusing on the interface between the Ag layer and the $Co_{50}Fe_{50}$ layer in FIG. 9 (a), it has been found that a dislocation exists and the crystals near the interface are distorted. However, when focusing on the interface between the Cu layer and the $Co_{50}Fe_{50}$ layer in FIG. 9 (b), surprisingly, defects such as dislocations have not been confirmed at an atomic resolution level, and the Cu layer and the $Co_{50}Fe_{50}$ layer have been found to be as if they were a single material. Although not shown in the figures, it has been confirmed that the samples of, for example, Example 2, Example 4 to Example 6, Example 8, and Example 9, in each of which the thickness of the Cu layer is about 2 nm are the same state as in FIG. 9 (b).

FIG. 9 (c), (d) and (e), (f) show the electron diffraction patterns of the samples of Example 7 and Example 3, respectively. According to FIG. 9 (c), (d), it has been found that the sample of Example 7 has the relationship of bcc-$Co_{50}Fe_{50}$ (001) [110]//fcc-Ag (001) [100]. On the other hand, according to FIG. 9 (e), (f), in the sample of Example 3, it has been found that the diffraction pattern of bcc-$Co_{50}Fe_{50}$ and the diffraction pattern of Cu are very similar to each other, which are different from the relationship of the diffraction patterns in FIG. 9 (c), (d). This indicates that Cu has a bcc crystal structure, as is the case with the bcc-$Co_{50}Fe_{50}$. Although not shown in the figures, it has been confirmed that the samples of, for example, Example 2, Example 4 to Example 6, Example 8, and Example 9, in each of which the thickness of the Cu layer is about 2 nm have the same diffraction pattern as in FIG. 9 (e), (f).

FIG. 10 (a) and (b) are images showing HAADF-STEM images taken from the $Co_{50}Fe_{50}$ [100] and [010] crystal zone axes when rotated 45° clockwise and counterclockwise from FIG. 9 (b), respectively. According to FIGS. 10 (a) and (b), both images are similar to each other, and there is no visible lattice distortion at the interface between the $Co_{50}Fe_{50}$ layer and the Cu layer.

If Cu has an fcc crystal structure, a 45° clockwise image and a 45° counterclockwise image are different from each other, and lattice distortion should occur at the interface between the $Co_{50}Fe_{50}$ layer and the Cu layer. However, as described above, the 45° clockwise image and the 45° counterclockwise image are similar to each other and no lattice distortion can be confirmed at the interface, so that it can be said that Cu has a bcc crystal structure like the crystal structure of the $Co_{50}Fe_{50}$, and both the $Co_{50}Fe_{50}$ layer and the Cu layer are a single crystal (001)-oriented layer.

It has been confirmed that in the sample of Example 5, both the Fe layer and the Cu layer have a bcc crystal structure and are single crystal (001)-oriented layers, as reported by "B. Heinrich et al., Phys. Rev. Lett., Vol. 64, No. 6, 1990". It has been also confirmed that the same relationship exists also for the $Co_{100-p}Fe_p$ layer and the Cu layer. With this respect, it should be noted that the inventors of the present application have been firstly confirmed it.

FIGS. 11 (a) and (b) show the atomic resolution HAADF-STEM images of the cross sections of the samples of Example 3, in which the thicknesses of the Cu layers are 2.1 nm and 4.3 nm, respectively. FIG. 11 (c), (d) and (e), (f) show the electron diffraction patterns of the samples of Example 3, in which the thicknesses of the Cu layers are 2.1 nm and 4.3 nm, respectively. Here, FIG. 11 (a), (c), and (d) are the same as FIG. 9 (b), (e), and (f), respectively.

According to FIG. 11 (b), slight lattice distortion has been confirmed at the interface between the Cu layer and the $Co_{50}Fe_{50}$ layer when the thickness of the Cu layer becomes large. According to FIGS. 11 (e) and (f), it has been found that the Cu layer maintains a bcc crystal structure. From this, in order that the Cu layer can maintain a bcc crystal structure and have good lattice matching at the interface, it can be said that the upper limit of the thickness of the Cu layer is preferably 5 nm. As for the lower limit, in the case where a Cu layer can be formed flatly and uniformly even if the thickness is 1 nm or less, its value is not particularly limited because of maintaining a bcc crystal structure. However, in consideration of efficiently forming the film by a general-purpose method such as sputtering, it is preferable to set the thickness to 1.5 nm or more.

Figure 12:
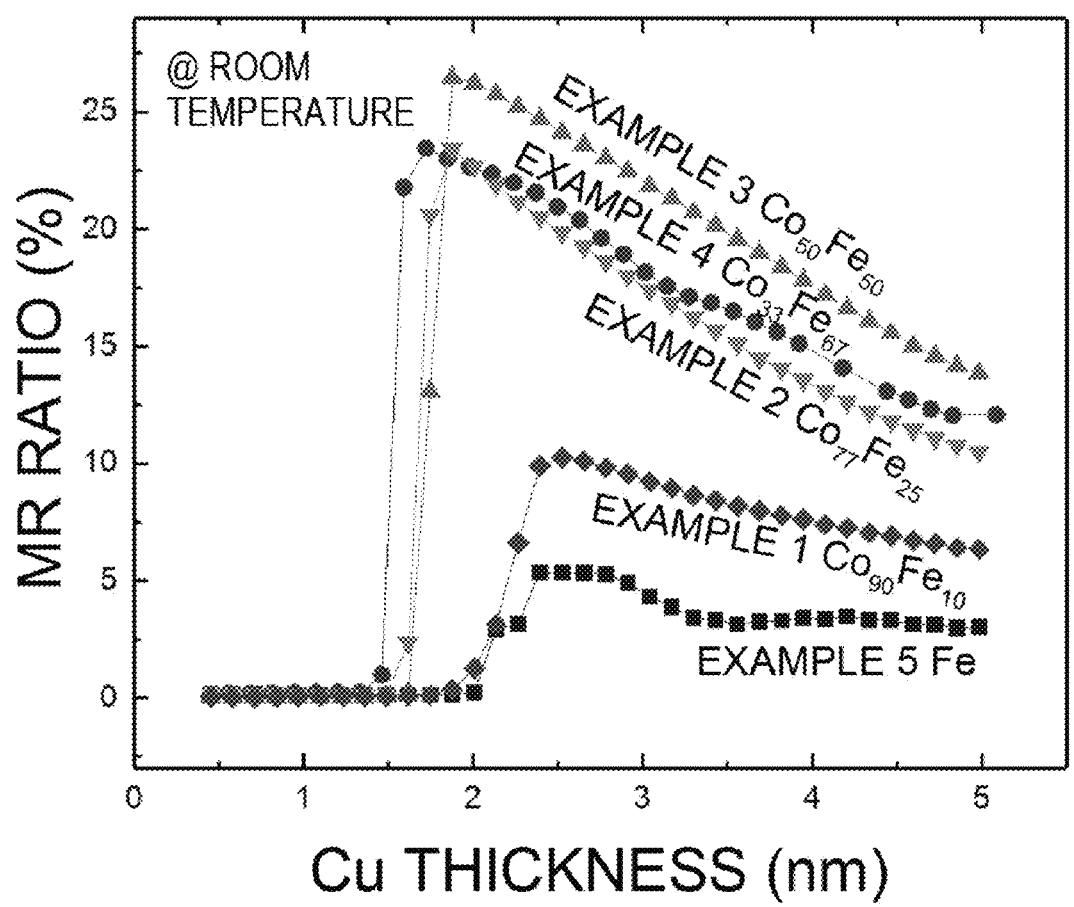
FIG. 12 is a graph showing the dependences of the MR ratio on the thickness of the Cu layer for the samples of Example 1 to Example 5.

FIG. 12 is a graph showing the dependence of the MR ratio on the thickness of the Cu layer for the samples of Example 1 to Example 5.

Figure 13:
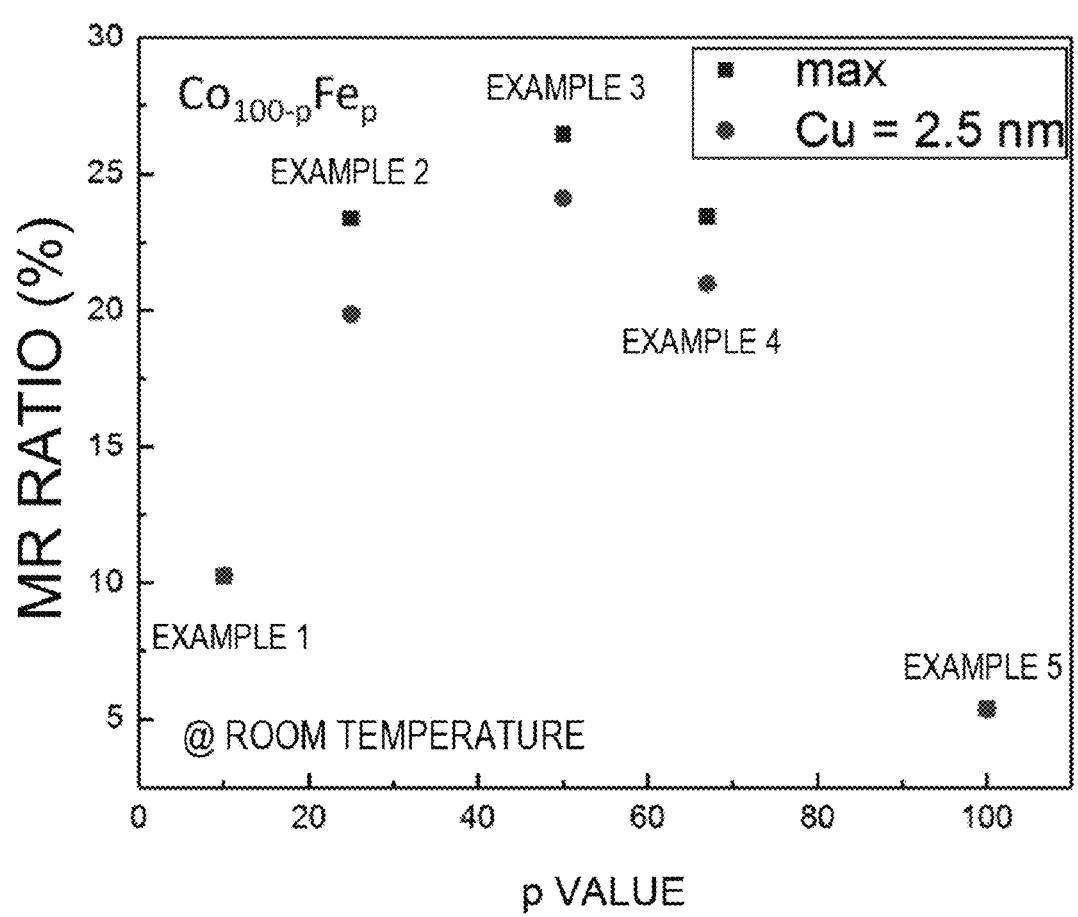
FIG. 13 is a graph showing the dependences of the MR ratio on the p value of the $Co_{100-p}Fe_p$ for the samples of Example 1 to Example 5.

FIG. 13 is a graph showing the dependence of the MR ratio on the p value of the $Co_{100-p}Fe_p$.

According to FIG. 12, it has been confirmed that in each of the samples, as the thickness of the Cu layer decreases, the MR ratio increases. Also, it has been confirmed that when the thickness of the Cu layer further decreases and the ferromagnetic layer is magnetically coupled, the MR ratio disappears. However, it has been found that the MR ratios of the samples of Example 2 to Example 4 are overall remarkably larger than those of the samples of Example 1 and Example 5. For example, it has been confirmed that the sample of Example 3 exhibits an MR ratio exceeding 25% at maximum.

From this, it has been shown that when in a laminated structure of a pair of $Co_{100-p}Fe_p$ layers, each of which has a bcc crystal structure and a Cu layer which has a bcc crystal structure and is positioned between the $Co_{100-p}Fe_p$ layers, each of the $Co_{100-p}Fe_p$ layers and the Cu layer is a single crystal (001)-oriented layer, such a laminated structure functions as a magnetoresistive film having a large MR ratio.

Also, it has been confirmed that the degrees of disappearance of the MR ratios in the samples of Example 2 to Example 4 are steeper than those in the samples of Example 1 and Example 5. This indicates that the interface between the $Co_{100-p}Fe_p$ layer and the Cu layer in each of the samples of Example 2 to Example 4 is smoother with no lattice distortion than that in each of Example 1 and Example 5, and it has been confirmed that this is well matched the above results of FIG. 9.

It has been confirmed that in every sample, when the Cu layer is 1.5 nm or less, the ferromagnetic layer is magnetically coupled and the MR ratio disappears. With this respect, it is understood that by improving the film quality and flatness of the Cu layer, a large MR ratio can be maintained. On the other hand, although depending on the p value of the $Co_{100-p}Fe_p$ layer, it has been shown that: an MR ratio is remarkably improved when the thickness of the Cu layer is preferably 1.5 nm or more; and when the thickness is up to 5 nm, a large MR ratio is maintained without particular film quality control and the like (for example, optimization of the film formation rate and substrate temperature at the time of the film formation of the Cu layer).

As described with reference to FIG. 8, it has been confirmed that although the sample of Example 1 shows an fcc crystal structure, for example, when providing a buffer layer such as $Co_{100-p}Fe_p$ (20≤p≤100) having a bcc crystal structure on a substrate, a magnetoresistive device (for example, $MgO/Co_{100-p}Fe_p/Co_{90}Fe_{10}/Cu/Co_{90}Fe_{10}/IrMn/Ta$, etc.) in which each of the ferromagnetic layers and the non-magnetic layer has a bcc crystal structure and is a single crystal (001)-oriented layer or is preferentially oriented on a (001) single crystal plane can be provided.

FIG. 13 shows the MR ratio values (shown by circles "●") of the samples of Example 1 to Example 5 in which the thickness of the Cu layer is 2.5 nm and the maximum values (shown by squares "■") of the MR ratios of the samples of Example 1 to Example 5. It has been confirmed that each of the samples of Example 2 to Example 4 has a large MR ratio of more than 20% or about 20%. On the other hand, it has been confirmed that the samples of Example 1 and Example 5 have a small MR ratio of 10% or less as before.

From this, it has been shown that the p-value of the $Co_{100-p}Fe_p$ layer, which is a binary alloy, is a value in a range of 20 or more and 75 or less, preferably a value in a range of 22 or more and 70 or less, more preferably a value in a range of 25 or more and 65 or less, and even more preferably a value in a range of 40 or more and 60 or less.

Figure 14:
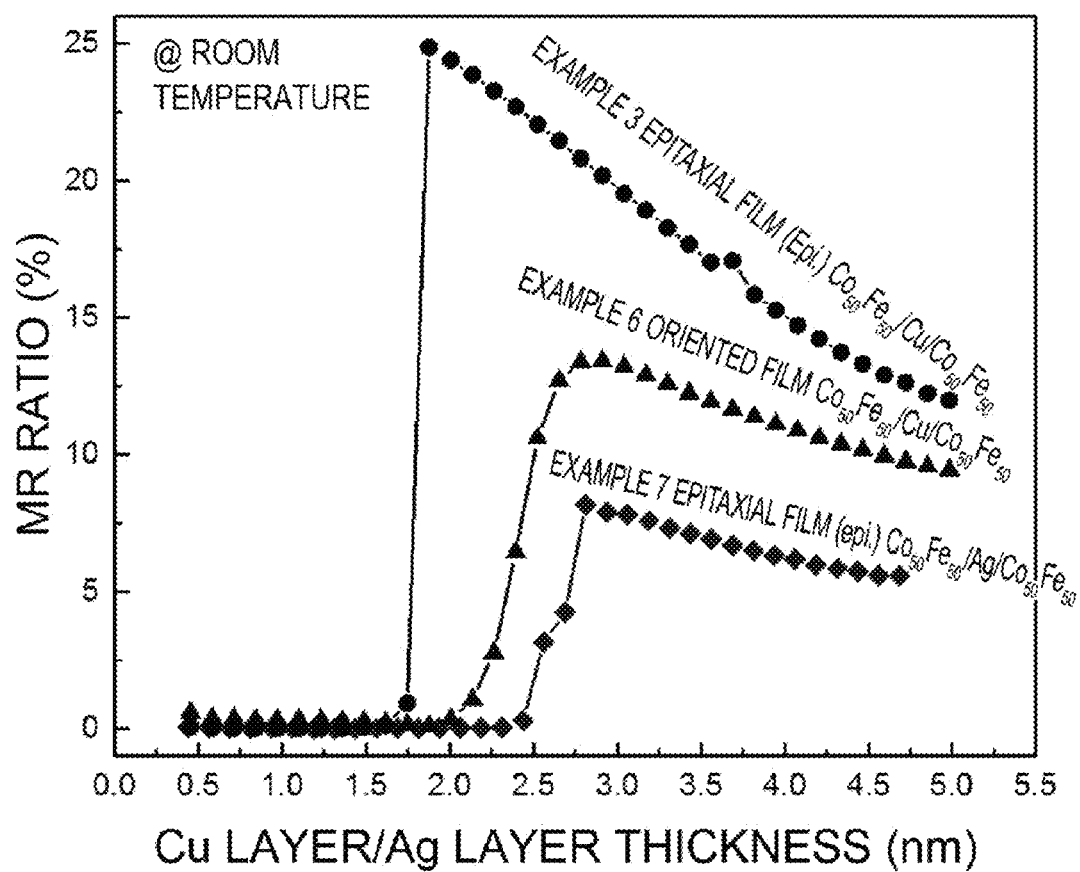
FIG. 14 is a graph showing the dependences of MR ratio on the thickness of Cu layer/Ag layer (i.e., Cu layer or Ag layer) for the samples of Example 3, Example 6, and Example 7.

FIG. 14 is a graph showing the dependence of the MR ratio on the thickness of the Cu layer/Ag layer for each of the samples of Example 3, Example 6, and Example 7.

In FIG. 14, the dependence of the MR ratio on the thickness of the Cu layer for the sample of Example 3 is the same as that in FIG. 12. According to FIG. 14, it has been confirmed that the MR ratio of the sample of Example 6 is smaller than that of the sample of Example 3, but larger than the MR ratio of the sample of Example 7. This indicates that, in the sample of Example 6, each of the $Co_{100-p}Fe_p$ layer and the Cu layer is preferentially oriented on a (001) crystal plane, thereby functioning as a magnetoresistive film that can obtain a large MR ratio.

Figure 15:
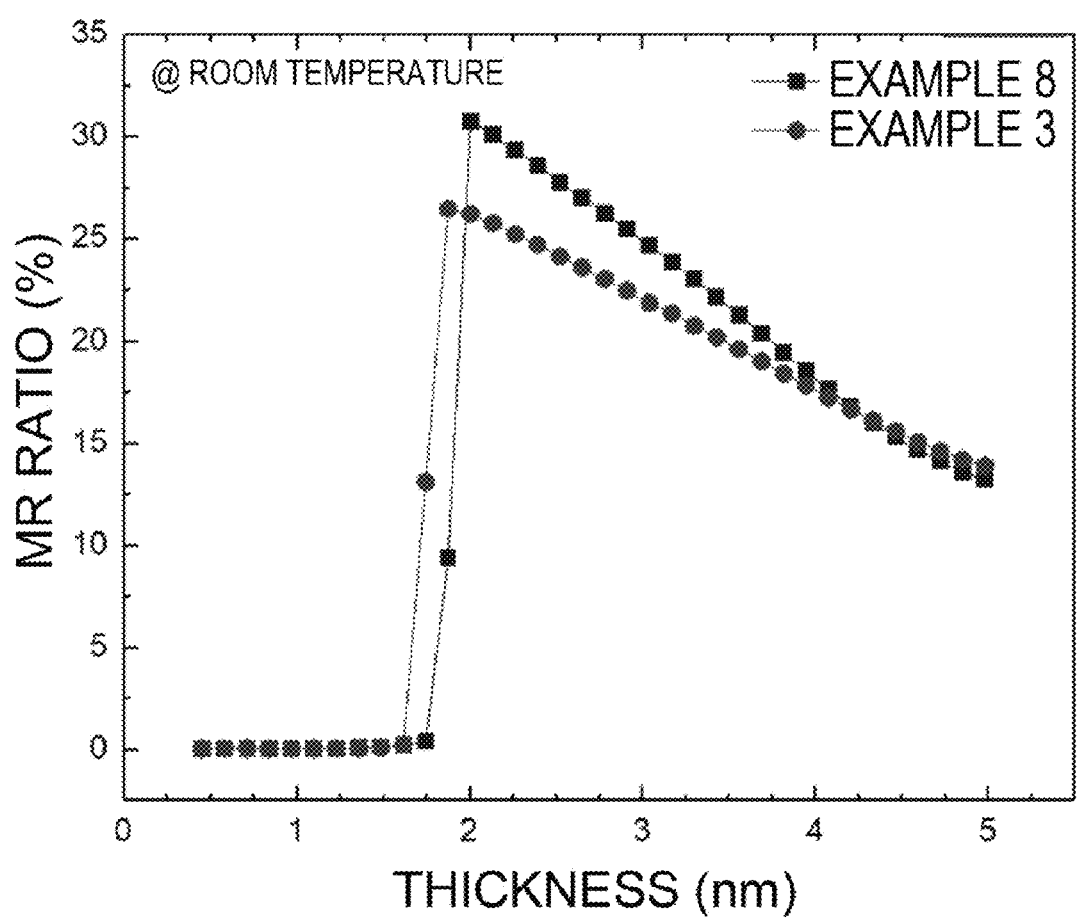
FIG. 15 is a graph showing the dependences of MR ratio on the thickness of Cu layer for the samples of Example 3 and Example 8.

FIG. 15 is a graph showing the dependence of the MR ratio on the thickness of the Cu layer for each of the samples of Example 3 and Example 8.

Figure 16:
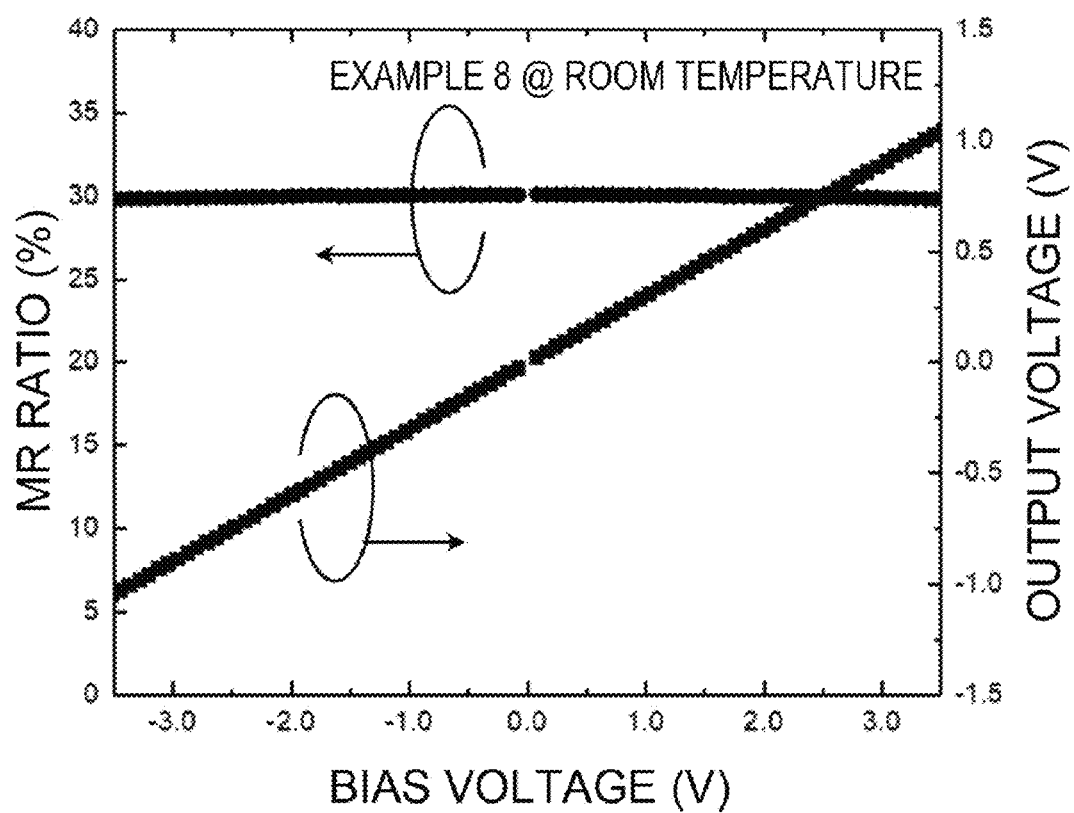
FIG. 16 is a graph showing the bias voltage dependences of MR ratio and output voltage for the sample of Example 8.

FIG. 16 is a graph showing the bias voltage dependences of the MR ratio and the output voltage for the sample of Example 8.

According to FIG. 15, it has been found that the MR ratio of the sample of Example 8 is larger than that of the sample of Example 3. From this, it has been found that in the case where a magnetoresistive device has a magnetoresistive film that repeats two or more structures, each structure is composed of a pair of ferromagnetic layers (bcc-$Co_{100-p}Fe_p$) and a non-magnetic layer (bcc-Cu), and further each layer of them is a single crystal (001)-oriented layer or is preferentially oriented on a (001) crystal plane, the magnetoresistive device exhibits a larger MR ratio and is advantageous.

According to FIG. 16, it has been confirmed that in the case where the bias voltage varies up to 3.0 V, the MR ratio of the sample of Example 8 does not change, and the output voltage changed linearly. From this, it has been shown that the magnetoresistive device of the present invention is advantageous for obtaining a high voltage output due to a magnetoresistive effect.

Figure 17:
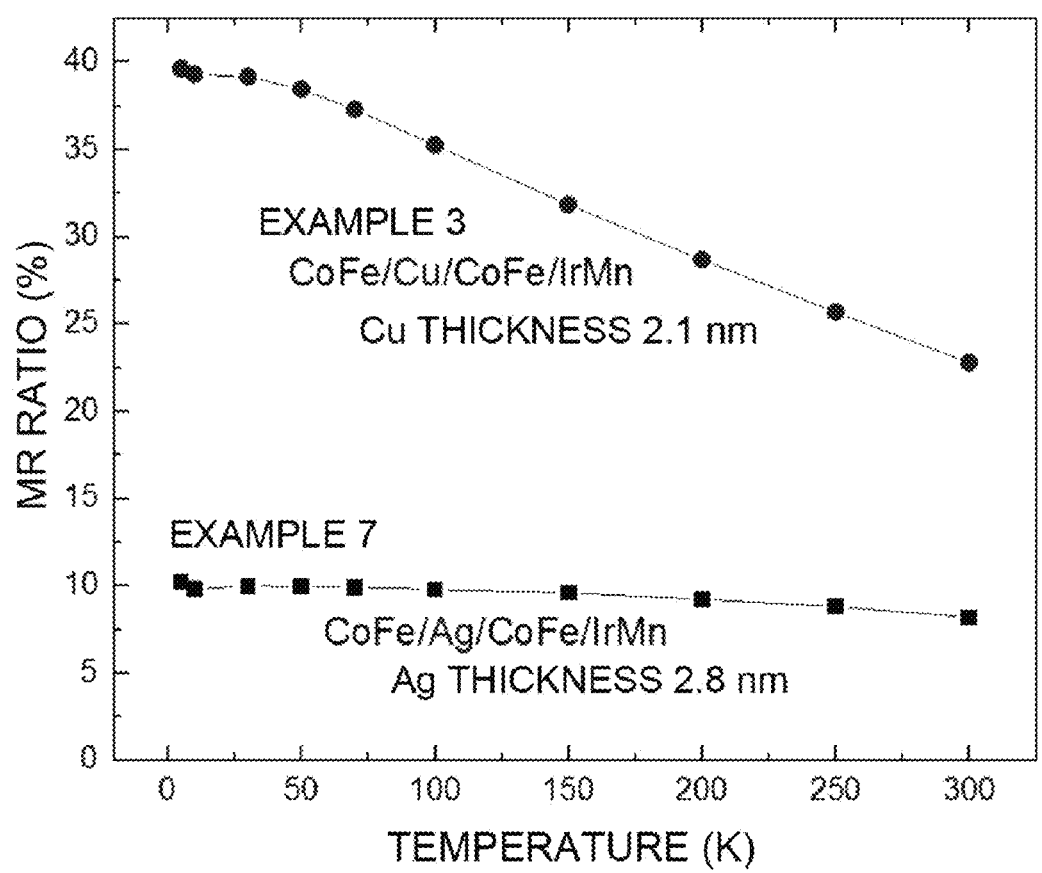
FIG. 17 is a graph showing the temperature dependence of MR ratio for the samples of Example 3 and Example 7.

FIG. 17 is a graph showing the temperature dependence of the MR ratio for the samples of Example 3 and Example 7.

Figure 18:
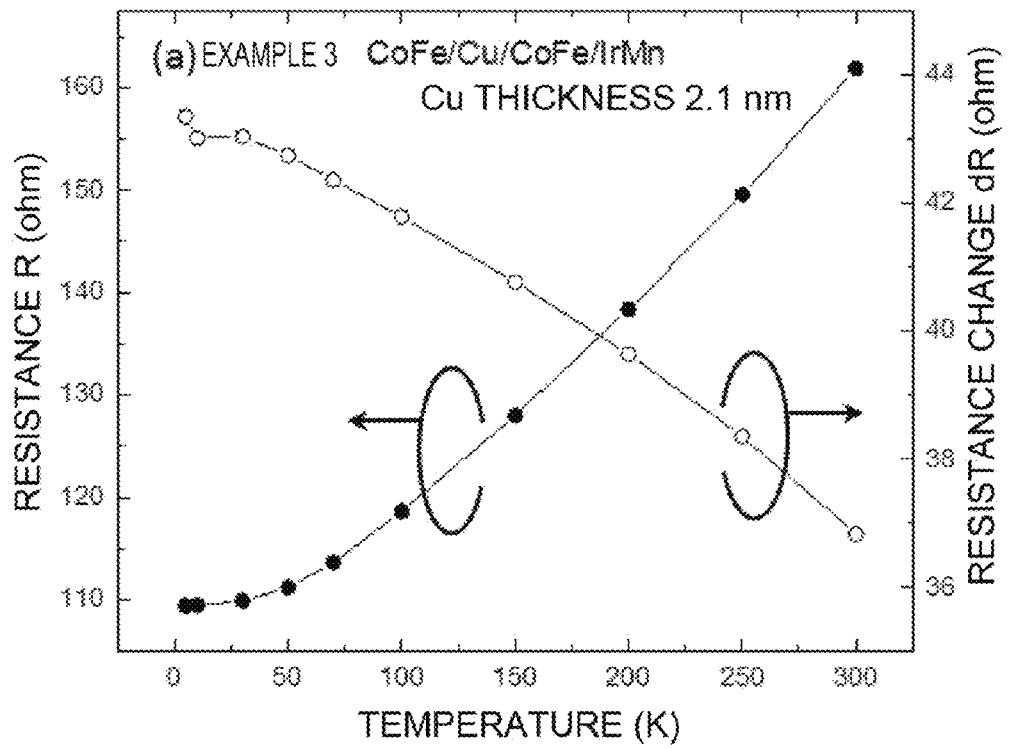
FIG. 18 is graphs showing the temperature dependences of resistance (R) and resistance change (dR) for the samples of (a) Example 3 and (b) Example 7.
Figure 18:
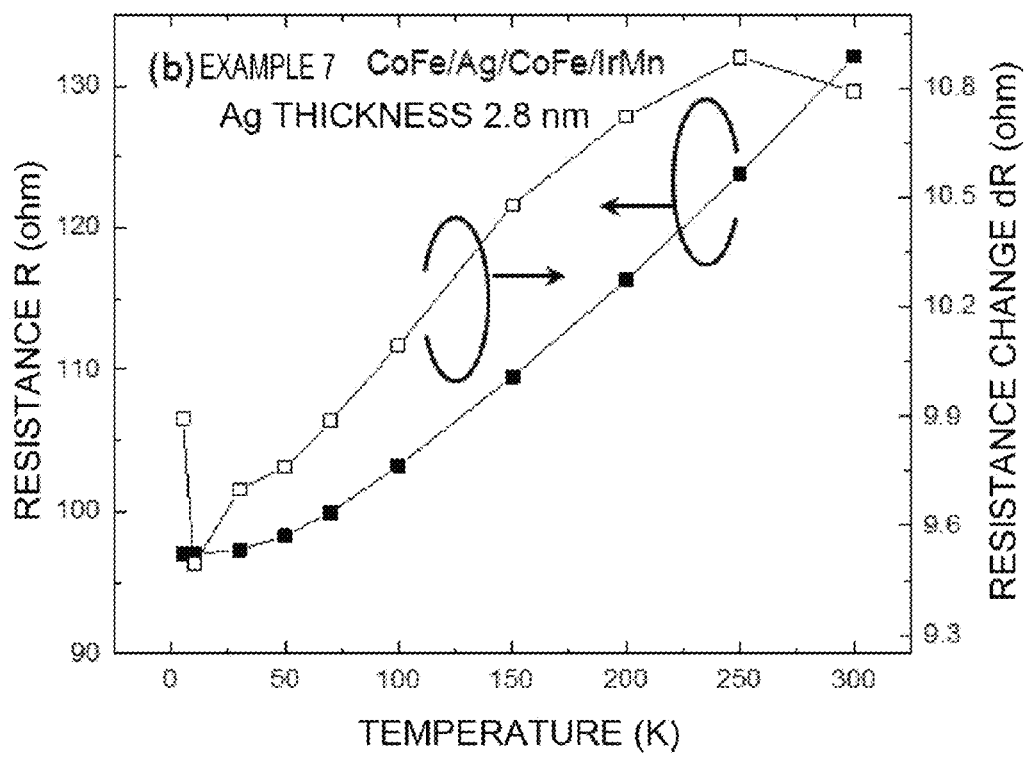

FIG. 18 is graphs showing the temperature dependences of the resistance (R) and the resistance change (dR) for the samples of Example 3 and Example 7.

According to FIG. 17, it has been confirmed that in the sample of Example 3, the MR ratio further increases as the temperature decreases, and an MR ratio of up to 40% is obtained at 10K. On the other hand, it has been confirmed that in the sample of Example 7, the MR ratio maintains a small value of about 10% even when the temperature decreases, and does not change.

In FIG. 18, the temperature dependence of the MR ratio obtained in FIG. 17 is shown separately for resistance "R" and resistance change "dR". It has been confirmed that focusing on the temperature dependence of the resistance "R", both the sample of Example 3 and the sample of Example 7 exhibit the same temperature dependence. However, it has been confirmed that focusing on the resistance change "dR", the resistance change "dR" of the sample of Example 3 increases as the temperature decreases, but that of the sample of Example 7 decreases as the temperature decreases. This indicates the following: when the mean free path of electrons becomes long at low temperature, the effect of interfacial scattering on spin asymmetry increases and the MR ratio improves; and the band matching of majority-spin electrons at the interface between the $Co_{100-p}Fe_p$ layer and the Cu layer in the sample of Example 3 is higher than that between the $Co_{100-p}Fe_p$ layer and the Ag layer in the sample of Example 7.

Figure 19:
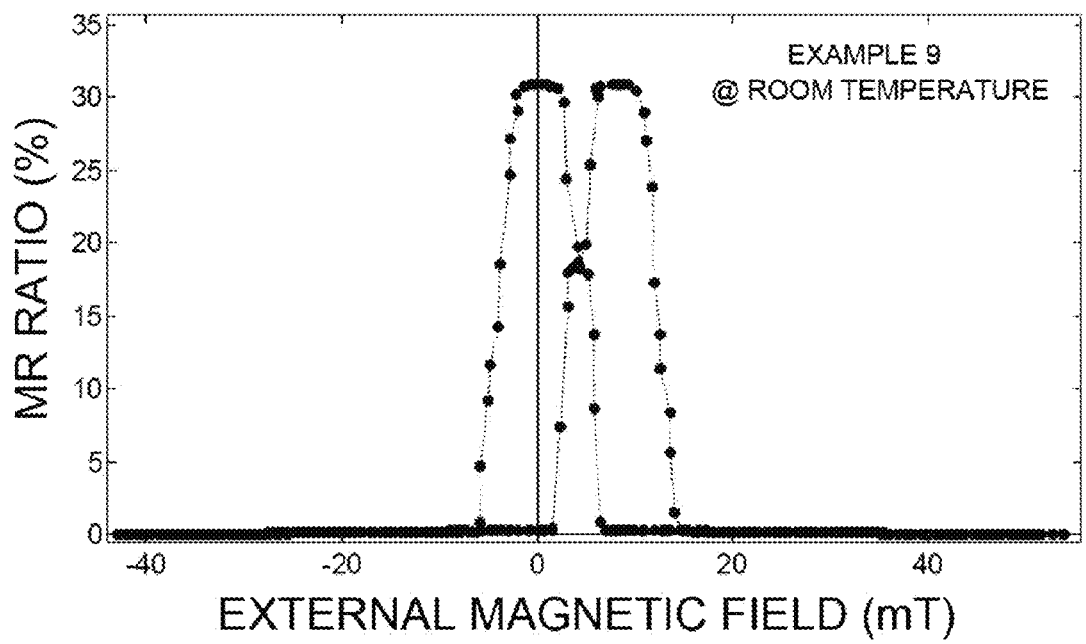
FIG. 19 is a graph showing the external magnetic field dependence of MR ratio for the sample of Example 9.

FIG. 19 is a graph showing the external magnetic field dependence of the MR ratio for the sample of Example 9.

According to FIG. 19, it has been shown that: when the sample of Example 9 uses, above and below, $Co_{50}Fe_{50}$ layers having the same thickness and the same composition, there is no difference in coercive force; even when no exchange bias due to an antiferromagnet is applied, a clear antiferromagnetic state is realized with zero external magnetic field; and an MR ratio as large as 31% is exhibited. This indicates that in the sample of Example 9, the magnetization of the $Co_{50}Fe_{50}$ layer creates an antiparallel state by an interlayer exchange interaction via Cu. Therefore, when forming an artificial lattice by multiply laminating this layer, a magnetized state in which adjacent $Co_{50}Fe_{50}$ layers are alternately antiparallel aligned can be realized. As a result, a magnetoresistive device exhibiting an even larger MR ratio can be expected.

FIG. 20 is graphs showing the band structures of bcc-Cu, bcc-$Co_{50}Fe_{50}$, and bcc-Fe by the first-principles calculation.

FIG. 21 is graphs showing the band structures of (a) bcc-Co, (b) bcc-$Co_{75}Fe_{25}$, and (c) bcc-$Co_{25}Fe_{75}$ by the first-principles calculation.

FIG. 20 (a) shows the band structure of bcc-Cu, FIG. 20 (b) and FIG. 20 (c) show the band structures of bcc-$Co_{50}Fe_{50}$ in a majority spin state and a minority spin state, respectively, and FIG. 20 (d) and FIG. 20 (e) show the band structures of bcc-Fe in a majority spin state and a minority spin state, respectively.

Comparing FIG. 20 (a) and FIG. 20 (b) (for example, focusing on the vicinity of the Fermi level), the band dispersion of bcc-Cu is very similar to the majority spin state of bcc-$Co_{50}Fe_{50}$, and the band structures are well matched. Comparing FIG. 20 (a) and FIG. 20 (c), the band dispersion of bcc-Cu is different from the minority spin state of bcc-$Co_{50}Fe_{50}$. Comparing FIG. 20 (a) and FIG. 21 (a) to (c), the band dispersion of bcc-Cu is very similar to the majority spin states of bcc-Co, bcc-$Co_{75}Fe_{25}$, and bcc-$Co_{25}Fe_{75}$, and the band structures are well matched.

As a result, the up-spin electrons can move more easily between the bcc-$Co_{100-p}Fe_p$ layer (wherein the parameter p satisfies a value in a range of 0≤p≤75) and the bcc-Cu layer than the down-spin electrons. A large MR ratio can be obtained due to such high spin asymmetry.

On the other hand, it has been confirmed that although bcc-Fe which is similar to the bcc-$Co_{50}Fe_{50}$ layer has a small lattice mismatch with bcc-Cu, the MR ratio is small as shown for the sample of Example 5 in FIG. 12. From the comparison of FIG. 20 (a) with FIGS. 20 (d) and (e), this can be understood as being due to the facts that the band dispersion of bcc-Cu is different from the majority spin state and minority spin state of bcc-Fe, and thus there is no matching of band structure at the Fermi level (E−$E_F$=0).

In order to improve an MR ratio, it has been shown from these results that not only the lattice matching between ferromagnetic layers and a non-magnetic layer but also matching of band structure between the ferromagnetic layers and the non-magnetic layer is important. The inventors of the present application have found that a ferromagnetic layer having a body-centered cubic (bcc) crystal structure and being represented by the general formula: $Co_{100-p}Fe_p$ (wherein parameter p satisfies a value in a range of 0≤p≤75) and a non-magnetic layer having a body-centered cubic (bcc) crystal structure and being composed of Cu exhibit good matching of band structure, as shown in FIG. 20 and FIG. 21. Further, by making these layers single crystal (001)-oriented layers or to be preferentially oriented on a (001) crystal plan, the inventors have succeeded in developing a magnetoresistive device in which lattices are well lattice-matched at the interface without distortion and a large MR ratio is achieved.

INDUSTRIAL APPLICABILITY

Since the magnetoresistive device of the present invention exhibits a large MR ratio even when used in the CIP type, it is applied to a magnetic sensor, a reproducing head, and a magnetic recording and reproducing device, each of which has high sensitivity to a magnetic field due to such a large MR ratio.

REFERENCE SIGNS LIST

100, $100_A$, $100_B$, 300, 400: magnetoresistive device
110, 310, 410: magnetoresistive film
120, $120_n$, 140: ferromagnetic layer
130, $130_n$: non-magnetic layer
150: substrate
320: antiferromagnetic layer
500: magnetic sensor
600: magnetic head
610: reproducing head
620: recording head
611: slider
612, 621, 623: insulating layer
613: lower shield layer
614: lower gap insulating layer
615: magnetic domain control layer
616: pair of terminal layers
617: upper gap insulating layer
618: upper shield layer
622: lower magnetic pole
624: recording gap layer
625: upper magnetic pole
626: coil
700: magnetic recording and reproducing device
710: housing
720: actuator
730: actuator arm
740: head slider
750: magnetic recording medium

The invention claimed is:

1. A magnetoresistive device comprising a magnetoresistive film, wherein:
   the magnetoresistive film is provided with at least a pair of ferromagnetic layers and a non-magnetic layer positioned between the pair of ferromagnetic layers;
   each of the pair of ferromagnetic layers is a layer having a body-centered cubic (bcc) crystal structure and being represented by a general formula: $Co_{100-p}Fe_p$ (wherein the parameter p satisfies a value in a range of 0≤p≤75, and the ferromagnetic layers constituting the pair have a same value for the parameter p each other or a different value for the parameter p each other);
   the non-magnetic layer is a layer having a body-centered cubic (bcc) crystal structure and being composed of Cu; and
   each of the pair of ferromagnetic layers and the non-magnetic layer is a single crystal (001)-oriented layer or is preferentially oriented on a (001) crystal plane;
   the magnetoresistive film has two or more multilayer structures, each of which is composed of the pair of ferromagnetic layers and the non-magnetic layer positioned between the pair of ferromagnetic layers, and each of the two or more multilayer structures is separated by an insulating layer; and
   the magnetoresistive device being a CIP type in which a current flows in an in-plane direction of the magnetoresistive film.

2. The magnetoresistive device according to claim 1, wherein the parameter p satisfies a value in a range of 0≤p≤70.

3. The magnetoresistive device according to claim 2, wherein the parameter p satisfies a value in a range of p=0 or 22≤p≤70.

4. The magnetoresistive device according to claim 2, wherein the parameter p satisfies a value in a range of 0≤p≤65.

5. The magnetoresistive device according to claim 4, wherein the parameter p satisfies a value in a range of p=0 or 25≤p≤65.

6. The magnetoresistive device according to claim 1, wherein the non-magnetic layer has a thickness in a range of 1.5 nm or more and 5 nm or less.

7. The magnetoresistive device according to claim 1, wherein each of the ferromagnetic layers constituting the pair has a thickness in a range of 1.5 nm or more and 15 nm or less.

8. The magnetoresistive device according to claim 1, wherein the magnetoresistive film is further provided with an antiferromagnetic layer that is magnetically coupled to one of the pair of ferromagnetic layers.

9. The magnetoresistive device according to claim 8, wherein the antiferromagnetic layer is selected from the group consisting of an IrMn layer, an FeMn layer, a PtMn layer, and a CoO layer.

10. A magnetoresistive device comprising a magnetoresistive film wherein:
the magnetoresistive film is provided with at least a pair of ferromagnetic layers and a non-magnetic layer positioned between the pair of ferromagnetic layers;
each of the pair of ferromagnetic layers is a layer having a body-centered cubic (bcc) crystal structure and being represented by a general formula: $Co_{100-p}Fe_p$ (wherein the parameter p satisfies a value in a range of 0≤p≤75, and the ferromagnetic layers constituting the pair have a same value for the parameter p each other or a different value for the parameter p each other);
the non-magnetic layer is a layer having a body-centered cubic (bcc) crystal structure and being composed of Cu;
each of the pair of ferromagnetic layers and the non-magnetic layer is a single crystal (001)-oriented layer or is preferentially oriented on a (001) crystal plane;
the magnetoresistive film has an artificial lattice structure in which the ferromagnetic layer and the nonmagnetic layer are repeatedly laminated; and
the magnetoresistive device being a CIP type in which a current flows in an in-plane direction of the magnetoresistive film.

11. The magnetoresistive device according to claim 1, wherein each of the ferromagnetic layers has a different coercive force.

12. The magnetoresistive device according to claim 1, wherein:
the magnetoresistive film is positioned on a substrate; and
the substrate is selected from the group consisting of a glass substrate, an alumina substrate, Si single crystal with or without a thermal oxide film, MgO single crystal, sapphire single crystal, $SrTiO_3$ single crystal, $MgAl_2O_4$ single crystal, and $TiO_2$ single crystal.

13. The magnetoresistive device according to claim 12, wherein the substrate is further provided with a buffer layer.

14. The magnetoresistive device according to claim 1, wherein the magnetoresistive film is further provided with a cap layer.

15. A magnetic sensor comprising a magnetoresistive device according to claim 1.

16. A magnetic sensor comprising a magnetoresistive device according to claim 10.

17. A magnetoresistive device comprising a magnetoresistive film, wherein:
the magnetoresistive film is provided with at least a pair of ferromagnetic layers and a non-magnetic layer positioned between the pair of ferromagnetic layers;
each of the pair of ferromagnetic layers is a layer having a body-centered cubic (bcc) crystal structure and being represented by a general formula: $Co_{100-p}Fe_p$ (wherein the parameter p satisfies a value in a range of 0≤p≤75, and the ferromagnetic layers constituting the pair have a same value for the parameter p each other or a different value for the parameter p each other);
the non-magnetic layer is a layer having a body-centered cubic (bcc) crystal structure and being composed of Cu;
each of the pair of ferromagnetic layers and the non-magnetic layer is a single crystal (001)-oriented layer or is preferentially oriented on a (001) crystal plane; and
the magnetoresistive film has two or more multilayer structures, each of which is composed of the pair of ferromagnetic layers and the non-magnetic layer positioned between the pair of ferromagnetic layers, and each of the two or more multilayer structures is separated by an insulating layer.

18. A magnetoresistive device comprising a magnetoresistive film, wherein:
the magnetoresistive film is provided with at least a pair of ferromagnetic layers and a non-magnetic layer positioned between the pair of ferromagnetic layers;
each of the pair of ferromagnetic layers is a layer having a body-centered cubic (bcc) crystal structure and being represented by a general formula: $Co_{100-p}Fe_p$ (wherein the parameter p satisfies a value in a range of 0≤p≤75, and the ferromagnetic layers constituting the pair have a same value for the parameter p each other or a different value for the parameter p each other);
the non-magnetic layer is a layer having a body-centered cubic (bcc) crystal structure and being composed of Cu;
each of the pair of ferromagnetic layers and the non-magnetic layer is a single crystal (001)-oriented layer or is preferentially oriented on a (001) crystal plane; and
the magnetoresistive film has an artificial lattice structure in which the ferromagnetic layer and the non-magnetic layer are repeatedly laminated.

19. A magnetic sensor comprising a magnetoresistive device according to claim 17.

20. A magnetic sensor comprising a magnetoresistive device according to claim 18.

* * * * *